(12) United States Patent
Lee et al.

(10) Patent No.: US 10,455,065 B2
(45) Date of Patent: Oct. 22, 2019

(54) MOBILE TERMINAL

(71) Applicant: LG ELECTRONICS INC., Seoul (KR)

(72) Inventors: Jaewon Lee, Seoul (KR); Seungwoo Ryu, Seoul (KR); Joohee Lee, Seoul (KR); Junyoung Jung, Seoul (KR); Jaewan Kim, Seoul (KR); Sangjo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/034,215

(22) Filed: Jul. 12, 2018

(65) Prior Publication Data

US 2019/0104212 A1    Apr. 4, 2019

Related U.S. Application Data

(60) Provisional application No. 62/565,116, filed on Sep. 29, 2017, provisional application No. 62/587,442, filed on Nov. 16, 2017.

(30) Foreign Application Priority Data

May 2, 2018    (KR) ........................ 10-2018-0050813

(51) Int. Cl.
*H04M 1/02* (2006.01)
*H01Q 9/04* (2006.01)
(Continued)

(52) U.S. Cl.
CPC ........ *H04M 1/0277* (2013.01); *H01Q 1/2283* (2013.01); *H01Q 1/243* (2013.01);
(Continued)

(58) Field of Classification Search
CPC ... H04M 1/0277; H01Q 1/243; H01Q 9/0435; H01Q 1/38; H01Q 1/2283; H01Q 21/065; H01Q 1/40; H05K 5/0047
See application file for complete search history.

(56) References Cited

U.S. PATENT DOCUMENTS

2006/0139210 A1    6/2006  Stavros et al.
2006/0170597 A1*   8/2006  Kurashima ............. H01Q 1/22
                                                    343/700 MS (Continued)

OTHER PUBLICATIONS

PCT International Application No. PCT/KR2018/008552, Written Opinion of the International Searching Authority dated Dec. 12, 2018, 14 pages.

*Primary Examiner* — Marcos L Torres
(74) *Attorney, Agent, or Firm* — Lee, Hong, Degerman, Kang & Waimey PC

(57) ABSTRACT

The present disclosure discloses a mobile terminal, including a case forming a portion of an appearance; a circuit board disposed inside the case; a flexible printed circuit board electrically connected to the circuit board; a first connector mounted on the circuit board; a second connector mounted on the flexible printed circuit board and fastened to the first connector; and a first antenna having array elements mounted on the flexible printed circuit board, wherein the first antenna is disposed to face a side surface of the case to radiate beam-formed wireless signals through the side surface adjacent to one side of the circuit board.

19 Claims, 10 Drawing Sheets

(51) Int. Cl.

| | |
|---|---|
| *H01Q 1/38* | (2006.01) |
| *H05K 5/00* | (2006.01) |
| *H01Q 1/24* | (2006.01) |
| *H01Q 1/22* | (2006.01) |
| *H01Q 21/06* | (2006.01) |
| *H01Q 1/40* | (2006.01) |

(52) U.S. Cl.
CPC ............ *H01Q 1/38* (2013.01); *H01Q 9/0435* (2013.01); *H01Q 21/065* (2013.01); *H05K 5/0047* (2013.01); *H01Q 1/40* (2013.01)

(56) References Cited

U.S. PATENT DOCUMENTS

| | | |
|---|---|---|
| 2010/0321325 A1 | 12/2010 | Springer et al. |
| 2012/0206302 A1* | 8/2012 | Ramachandran ........ H01Q 1/24 343/702 |
| 2012/0268879 A1 | 10/2012 | Kim et al. |
| 2013/0257659 A1 | 10/2013 | Darnell et al. |
| 2014/0240179 A1 | 8/2014 | Kim et al. |
| 2015/0364813 A1* | 12/2015 | Darnell .................. H01Q 1/243 343/702 |
| 2017/0069958 A1* | 3/2017 | Ko ......................... H01Q 1/243 |
| 2018/0131087 A1* | 5/2018 | Kim ...................... H01L 23/552 |

\* cited by examiner

MOBILE TERMINAL

CROSS-REFERENCE TO RELATED APPLICATIONS

Pursuant to 35 U.S.C. § 119, this application claims the benefit of earlier filing date and right of priority to U.S. Provisional Application No. 62/565,116, filed on Sep. 29, 2017, 62/587,442, filed on Nov. 16, 2017, and also claims the benefit of Korean Application No. 10-2018-0050813, filed on May 2, 2018, the contents of which are all incorporated by reference herein in their entirety.

BACKGROUND OF THE INVENTION

1. Field of the Invention

The present disclosure relates to a mobile terminal having an antenna.

2. Description of the Conventional Art

A mobile/portable terminal is an electronic device that can be used while moving, and may be divided into a handheld terminal and a vehicle mounted terminal according to whether or not it can be directly carried by a user.

Such a mobile terminal has various functions according to the development of technologies. For example, the mobile terminal is implemented in the form of a multimedia player with various functions such capturing pictures or videos, playing music or video files, playing games, receiving broadcast, and the like. Moreover, in order to support and enhance the functions of the mobile terminal, the improvement of structural or software elements of the mobile terminal may be taken into consideration.

In order for a mobile terminal to provide a broadband service, the mobile terminal needs to perform wireless communication in a higher frequency band. In this regard, standardization for 5th generation (5G) communication services using a mmWave band is being carried out, and for this purpose, related researchers are newly designing and improving a 5G antenna structure.

On the other hand, in order to enhance or add functions of the mobile terminal, the greater variety of electronic devices (dual camera, fingerprint sensor, etc.) are added to mobile terminals. On another hand, research is underway to implement a mobile terminal in a slimmer manner. Accordingly, the area in which electronic devices can be mounted on a circuit board of the mobile terminal is getting smaller.

Because a 5G antenna includes array elements for beamforming, there is a limit to reducing the size. In addition, in order to reduce signal loss between the 5G antenna and the integrated circuit, the antenna and the integrated circuit are typically implemented as a 1-package (AIP: Antenna in Package), but there is a limit in reducing the AIP due to a size of the antenna.

Furthermore, the coverage of the 5G antenna is proportional to the number of AIPs. Therefore, although a larger number of AIPs are required to increase the coverage of the 5G antenna, there is a design limit due to the limitation of the size of the circuit board.

Due to components such as a power capacitor for driving an integrated circuit, a LO input connector and an IF output connector, a very large area of the circuit board to be allocated for mmWave serves as a design constraint.

SUMMARY OF THE INVENTION

A first object of the present disclosure is to provide a structure capable of reducing an area occupied by the components on a circuit board when a 5G antenna is constructed with the foregoing design constraints.

A second object of the present disclosure is to provide a structure capable of freely changing the installation position of a 5G antenna.

A third object of the present disclosure is to provide a structure capable of increasing the coverage of a 5G antenna.

A fourth object of the present disclosure is to provide a structure capable of more simply implementing wiring for a power source, a LO input, an IF output, and the like to be applied to an integrated circuit.

In order to accomplish the first object of the present disclosure, the present disclosure discloses a mobile terminal, including a circuit board; an integrated circuit mounted on the circuit board; a first connector mounted on the circuit board, and located at one side of the integrated circuit; an antenna provided with an antenna substrate and array elements mounted on the antenna substrate to control the transmission and reception of wireless signals by the integrated circuit, and disposed to cover the integrated circuit and the first connector; and a second connector mounted on a rear surface of the antenna substrate and electrically connected to the array elements, and fastened to the first connector.

The second connector may be disposed to face the first connector, and fastened to the first connector when the antenna is disposed to cover the integrated circuit and the first connector.

Either one of the first and second connectors may be a board-to-board receptacle connector, and the other one may be a board-to-board plug connector.

A support wall may be formed on the circuit board with the integrated circuit and the first connector interposed therebetween, wherein the antenna is supported by the support wall and disposed to cover the integrated circuit and the first connector.

The support wall may include a first wall disposed on one side of the integrated circuit and a second wall disposed on one side of the first connector, and is formed of a copper material.

A heat dissipation sheet is disposed between the integrated circuit and the antenna substrate.

The first object of the present disclosure may also be accomplished by a mobile terminal, including a case forming a portion of an appearance; a circuit board disposed inside the case; a flexible printed circuit board electrically connected to the circuit board; a first connector mounted on the circuit board; a second connector mounted on the flexible printed circuit board and fastened to the first connector; and a first antenna having array elements mounted on the flexible printed circuit board.

An integrated circuit for controlling the transmission and reception of wireless signals of the first antenna is mounted on a circuit board or a flexible printed circuit board.

In a structure in which the integrated circuit is mounted on the circuit board, the integrated circuit is mounted at a position adjacent to the first connector.

In a structure in which the integrated circuit is mounted on the flexible printed circuit board, the integrated circuit may be located between the first antenna and the second connector.

A shield can disposed to cover an electronic device may be provided within the case, and the integrated circuit may be attached to an upper surface of the shield can.

The first antenna may further include an antenna substrate mounted on the integrated circuit, and the array elements may be mounted on the antenna substrate.

An interposer supporting an antenna and having via for electrical connection with the antenna may be provided between the flexible printed circuit board and the first antenna outside the integrated circuit.

The second object of the present disclosure may be accomplished by disposing the first antenna mounted on the flexible printed circuit board at an appropriate position.

For example, the first antenna may be disposed to face a side surface of the case to radiate beam-formed wireless signals through the side surface adjacent to one side of the circuit board.

In this case, the case may include a metal portion formed of a metal material, and formed with an opening on the side surface facing the first antenna; and a dielectric portion disposed to cover the opening and formed of a dielectric material.

The first antenna may be attached to the dielectric portion or attached to a frame facing the dielectric portion.

In order to accomplish the third object of the present disclosure, a second antenna having array elements may be mounted on the flexible printed circuit board, and the first antenna and the second antenna may be disposed to face different directions.

For example, the second antenna may be disposed to face a rear surface of the case to radiate beam-formed wireless signals through the rear surface of the case facing the circuit board.

In this case, the case may include a metal portion formed of a metal material, and formed with a first opening and a second opening respectively formed on the side surface facing the first antenna and on the rear surface facing the second antenna; a first dielectric portion disposed to cover the first opening, and formed of a dielectric material; and a second dielectric portion disposed to cover the second opening, and formed of a dielectric material.

Either one of the first and second antennas may be configured with a patch array antenna, and the other one may be configured with a dipole array antenna.

The first antenna may be mounted at a portion extended from a portion on which the second antenna is mounted.

An integrated circuit for controlling the transmission and reception of wireless signals of the first and second antennas may be mounted on a circuit board or a flexible printed circuit board.

In a structure in which the integrated circuit is mounted on the circuit board, the integrated circuit may be mounted at a position adjacent to the first connector.

In a structure in which the integrated circuit is mounted on the flexible printed circuit board, the integrated circuit may be located between the second antenna and the second connector.

The fourth object of the present disclosure may be achieved by connecting the integrated circuit and the first connector with microstrip lines, connecting the second connector and the antenna elements with microstrip lines, and fastening the second connector to the first connector.

The effects of the present disclosure obtained through the foregoing solutions are as follows.

First, an antenna having array elements may be mounted on a flexible printed circuit board electrically connected to a circuit board, thereby reducing an area occupied by the antenna on the circuit board to overcome design constraints. Here, the integrated circuit may be mounted on a flexible printed circuit board or a circuit board.

Alternatively, an antenna including array elements may be arranged to cover the integrated circuit and the first connector mounted on the circuit board, and the second connector may be mounted on a rear surface of the antenna to be fastened to the first connector, thereby increasing a marginal mounting space on the circuit board.

As a result, the increased marginal mounting space of the circuit board may be as a space where other electronic devices can be mounted. Alternatively, a size of the circuit board may be reduced as much as the marginal mounting space, and the reduced area may be used as a battery area.

Second, an antenna having array elements may be mounted on the flexible printed circuit board, thereby increasing a degree of freedom of installation of the 5G antenna in the mobile terminal.

Third, a plurality of antennas having array elements may be mounted on a flexible printed circuit board and arranged in place, thereby extending the coverage of the 5G antenna.

Fourth, the integrated circuit and the first connector are connected with the microstrip lines, the second connector and the antenna elements are connected with microstrip lines, and the second connector is fastened to the first connector, thereby more simply implementing wiring for a LO input, an IF output, and the like.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
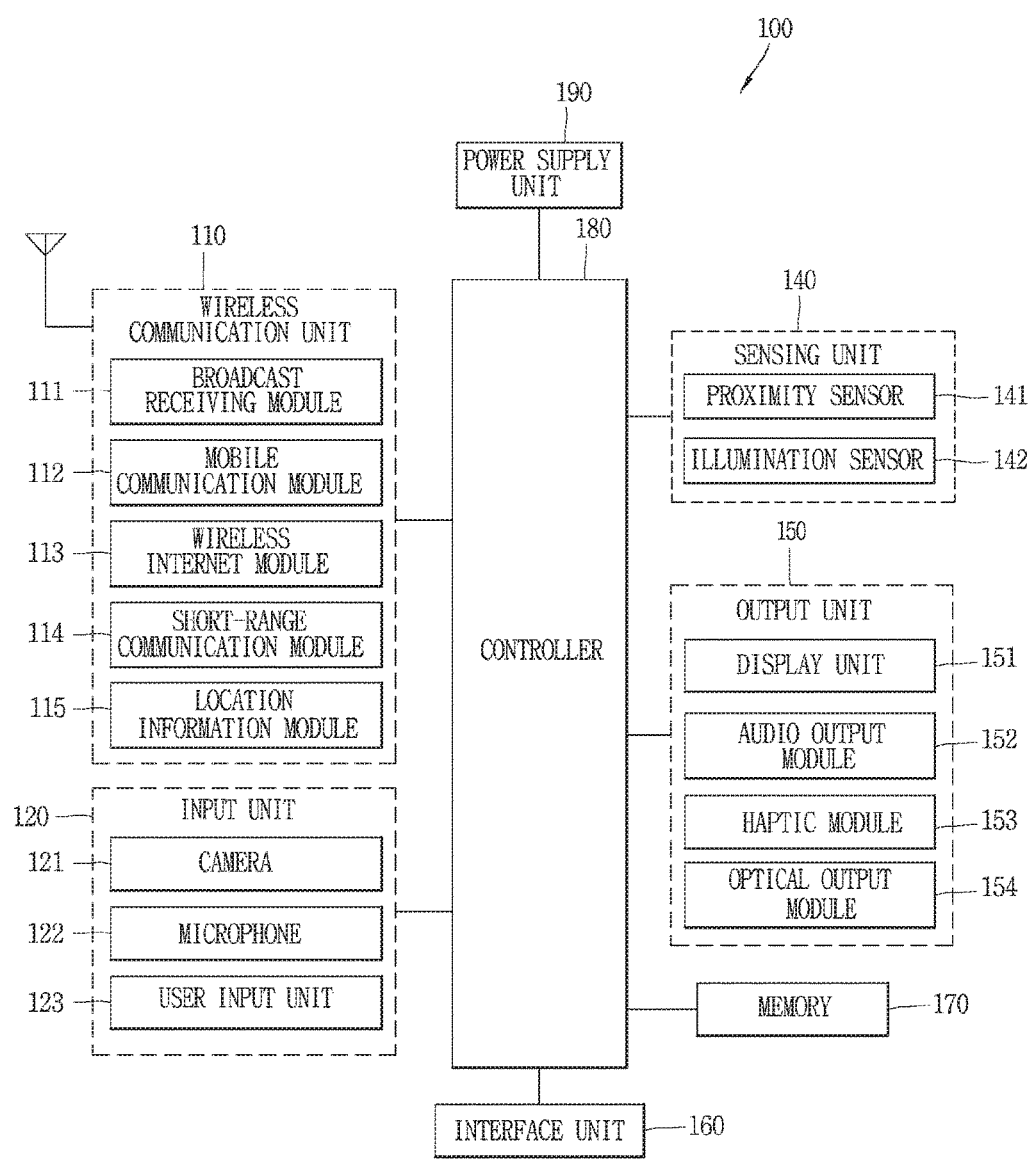
FIG. 1 is a block diagram for explaining a mobile terminal associated with the present disclosure.

Hereinafter, the embodiments disclosed herein will be described in detail with reference to the accompanying drawings, and the same or similar elements are designated with the same numeral references regardless of the numerals in the drawings and their redundant description will be omitted.

A suffix "module" and "unit" used for constituent elements disclosed in the following description is merely intended for easy description of the specification, and the suffix itself does not give any special meaning or function.

In describing the present disclosure, if a detailed explanation for a related known function or construction is considered to unnecessarily divert the gist of the present disclosure, such explanation has been omitted but would be understood by those skilled in the art.

The accompanying drawings are used to help easily understand the technical idea of the present disclosure and it should be understood that the idea of the present disclosure is not limited by the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. On the contrary, in case where an element is "directly connected" or "directly linked" to another element, it should be understood that any other element is not existed therebetween.

A singular representation may include a plural representation as far as it represents a definitely different meaning from the context.

Terms "include" or "has" used herein should be understood that they are intended to indicate an existence of several components or several steps, disclosed in the specification, and it may also be understood that part of the components or steps may not be included or additional components or steps may further be included.

Mobile terminals described herein may include cellular phones, smart phones, laptop computers, digital broadcasting terminals, personal digital assistants (PDAs), portable multimedia players (PMPs), navigators, slate PCs, tablet PCs, ultra books, wearable devices (for example, smart watches, smart glasses, head mounted displays (HMDs)), and the like.

However, it may be easily understood by those skilled in the art that the configuration according to the exemplary embodiments of this specification can also be applied to stationary terminals such as digital TV, desktop computers, digital signages, and the like, excluding a case of being applicable only to the mobile terminals.

Figure 2:
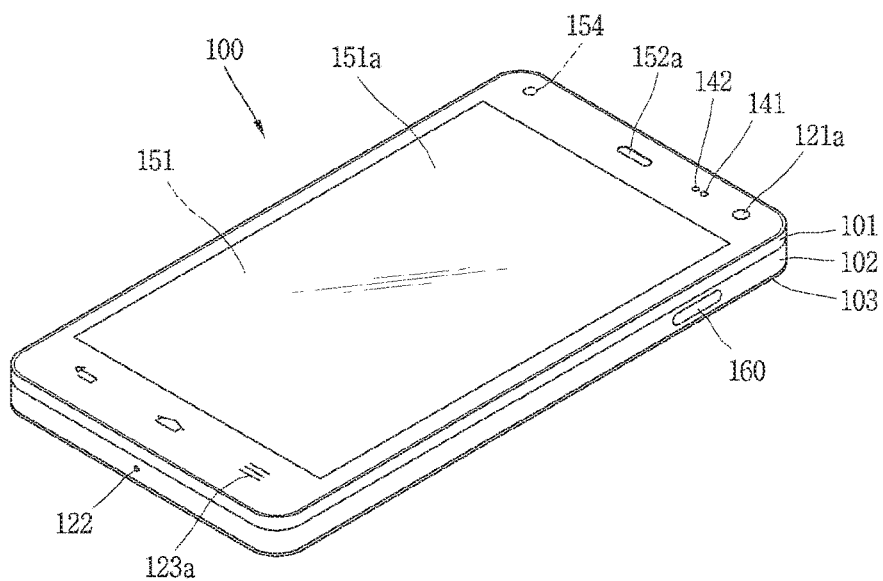
FIGS. 2 and 3 are conceptual views in which a mobile terminal according to an embodiment of the present disclosure is seen from different directions.
Figure 3:
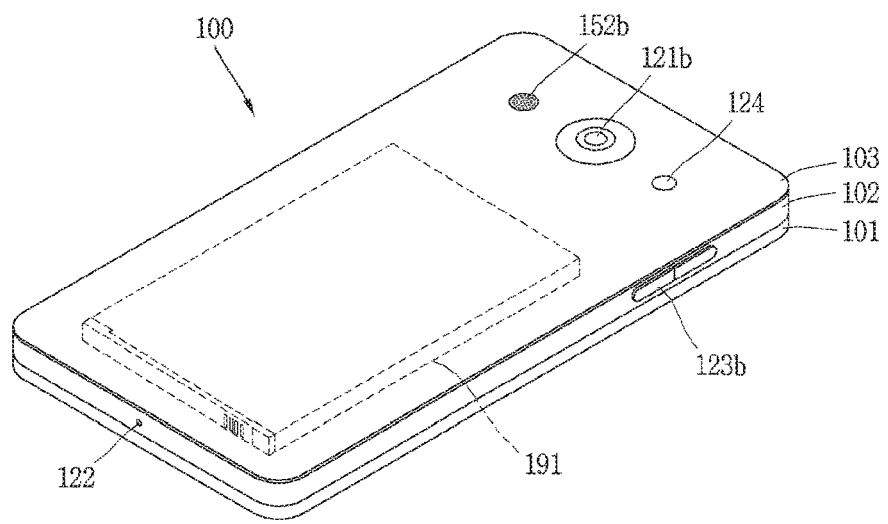

Referring to FIGS. 1 through 3, FIG. 1 is a block diagram for explaining a mobile terminal associated with the present disclosure, and FIGS. 2 and 3 are conceptual views illustrating an example in which the mobile terminal associated with the present disclosure is seen from different directions.

The mobile terminal 100 may include components, such as a wireless communication unit 110, an input unit 120, a sensing unit 140, an output unit 150, an interface unit 160, a memory 170, a controller 180, a power supply unit 190 and the like. It is understood that implementing all of the illustrated components is not a requirement, and that greater or fewer components may alternatively be implemented. Referring now to FIG. 1, the mobile terminal 100 is shown having wireless communication unit 110 configured with several commonly implemented components.

In more detail, the wireless communication unit 110 of those components may typically include one or more modules which permit wireless communications between the mobile terminal 100 and a wireless communication system, between the mobile terminal 100 and another mobile terminal 100, or between the mobile terminal 100 and an external server. In addition, the wireless communication unit 110 may include one or more modules that connect the mobile terminal 100 to one or more networks.

The wireless communication unit 110 may include at least one of a broadcast receiving module 111, a mobile communication module 112, a wireless Internet module 113, a short-range communication module 114, a location information module 115 and the like.

The input unit 120 may include a camera 121 for inputting an image signal, a microphone 122 or an audio input module for inputting an audio signal, or a user input unit 123 (for example, a touch key, a push key (or a mechanical key), etc.) for allowing a user to input information. Audio data or image data collected by the input unit 120 may be analyzed and processed by a user's control command.

The sensing unit 140 may include at least one sensor which senses at least one of internal information of the mobile terminal, a surrounding environment of the mobile terminal and user information. For example, the sensing unit 140 may include a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, refer to the camera 121), a microphone 122, a battery gage, an environment sensor (for example, a barometer, a hygrometer, a thermometer, a radiation detection sensor, a thermal sensor, a gas sensor, etc.), and a chemical sensor (for example, an electronic nose, a health care sensor, a biometric sensor, etc.). The mobile terminal 100 may be configured to utilize information obtained from sensing unit 140, and in particular, information obtained from one or more sensors of the sensing unit 140, and combinations thereof.

The output unit 150 may be configured to output an audio signal, a video signal or a tactile signal. The output unit 150 may include a display unit 151, an audio output module 152, a haptic module 153, an optical output unit 154 and the like. The display unit 151 may have an inter-layered structure or an integrated structure with a touch sensor in order to facilitate a touch screen. The touch screen may provide an output interface between the mobile terminal 100 and a user, as well as functioning as the user input unit 123 which provides an input interface between the mobile terminal 100 and the user.

The interface unit 160 serves as an interface with various types of external devices that can be coupled to the mobile terminal 100. The interface unit 160, for example, may include wired or wireless headset ports, external power supply ports, wired or wireless data ports, memory card ports, ports for connecting a device having an identification module, audio input/output (I/O) ports, video I/O ports, earphone ports, or the like. The mobile terminal 100 may execute an appropriate control associated with a connected external device, in response to the external device being connected to the interface unit 160.

In addition, the memory 170 stores data that support various functions of the mobile terminal 100. The memory 170 is typically implemented to store data to support various functions or features of the mobile terminal 100. For instance, the memory 170 may be configured to store application programs executed in the mobile terminal 100, data or instructions for operations of the mobile terminal 100, and the like. At least some of those application programs may be downloaded from an external server via wireless communication. Some others of those application programs may be installed within the mobile terminal 100 at the time of being shipped for basic functions of the mobile terminal 100 (for example, receiving a call, placing a call, receiving a message, sending a message, etc.). On the other hand, the application programs may be stored in the memory 170, installed in the mobile terminal 100, and executed by the controller 180 to perform an operation (or a function) of the mobile terminal 100.

The controller 180 may typically control an overall operation of the mobile terminal 100 in addition to the operations associated with the application programs. The controller 180 may provide or process information or functions appropriate for a user in a manner of processing signals, data, information and the like, which are input or output by the aforementioned components, or activating the application programs stored in the memory 170.

Furthermore, the controller 180 may control at least part of the components illustrated in FIG. 1, in order to drive the application programs stored in the memory 170. In addition, the controller 180 may drive the application programs by combining at least two of the components included in the mobile terminal 100 for operation.

The power supply unit 190 may receive external power or internal power and supply appropriate power required for operating respective elements and components included in the mobile terminal 100 under the control of the controller 180. The power supply unit 190 may include a battery, and the battery may be an embedded battery or a replaceable battery.

At least part of those elements and components may be combined to implement operation and control of the mobile terminal or a control method of the mobile terminal according to various exemplary embodiments described herein. Furthermore, the operation and control or the control method of the mobile terminal may be implemented in the mobile terminal in such a manner of activating at least one application program stored in the memory 170.

Hereinafter, each aforementioned component will be described in more detail with reference to FIG. 1, prior to explaining various exemplary embodiments implemented by the mobile terminal 100 having the configuration.

First, the wireless communication unit 110 will be described. The broadcast receiving module 111 of the wireless communication unit 110 may receive a broadcast signal and/or broadcast associated information from an external broadcast managing entity via a broadcast channel. The broadcast channel may include a satellite channel and/or a terrestrial channel. At least two broadcast receiving modules 111 may be provided in the mobile terminal 100 to simultaneously receive at least two broadcast channels or switch the broadcast channels.

The broadcast management server may mean a server that generates and transmits a broadcast signal and/or broadcast associated information or a server that receives a previously generated broadcast signal and/or broadcast associated information and transmits to the mobile terminal 100. The broadcast signal may be implemented as a TV broadcast signal, a radio broadcast signal, and a data broadcast signal, among others. The broadcast signal may further include a data broadcast signal combined with a TV or radio broadcast signal.

The broadcast signal may be encoded according to at least one of technical standards (or broadcasting methods, e.g., ISO, IEC, DVB, ATSC, etc.) for transmission and reception of digital broadcast signals. The broadcast receiving module 111 may receive the digital broadcast signals using a method appropriate for a technical specification defined in the technical standards.

The broadcast associated information may mean information regarding a broadcast channel, a broadcast program, a broadcast service provider, and the like. The broadcast associated information may also be provided through a mobile communication network. The broadcast associated information may be provided via a mobile communication network, and received by the mobile communication module 112.

The broadcast associated information may be implemented in various formats. For instance, broadcast associated information may include an Electronic Program Guide (EPG) of Digital Multimedia Broadcasting (DMB), an Electronic Service Guide (ESG) of Digital Video Broadcast-Handheld (DVB-H), and the like. Broadcast signals and/or broadcast associated information received via the broadcast receiving module 111 may be stored in a memory 170.

The mobile communication module 112 may transmit/receive wireless signals to/from at least one of network entities, for example, a base station, an external terminal, a server, and the like, on a mobile communication network, which is constructed according to technical standards or transmission methods for mobile communications (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), etc.)

Here, the wireless signals may include audio call signal, video (telephony) call signal, or various formats of data according to transmission/reception of text/multimedia messages.

The wireless Internet module 113 refers to a module for supporting wireless Internet access, and may be built-in or externally installed on the mobile terminal 100. The wireless Internet module 113 may transmit and/or receive wireless signals via communication networks according to wireless Internet technologies.

Examples of such wireless Internet access may include Wireless LAN (WLAN), Wireless-Fidelity (Wi-Fi), Wireless Fidelity Direct (Wi-Fi Direct), Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), LTE (Long Term Evolution), LTE-A (Long Term Evolution-Advanced), and the like. The wireless Internet module 113 may transmit/receive data according to at least one wireless Internet technology within a range including even Internet technologies which are not aforementioned.

From the perspective that the wireless Internet accesses according to Wibro, HSDPA, GSM, CDMA, WCDMA, LTE, LTE-A and the like are executed via a mobile communication network, the wireless Internet module 113 which performs the wireless Internet access via the mobile communication network may be understood as a type of the mobile communication module 112.

The short-range communication module 114 denotes a module for short-range communications. Suitable technologies for implementing the short-range communications may include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, and the like. The short-range communication module 114 may support wireless communications between the mobile terminal 100 and a wireless communication system, between the mobile terminal 100 and another mobile terminal 100, or between the mobile terminal and a network where another mobile terminal 100 (or an external server) is located, via wireless personal area networks. The short-range communication module 114 denotes a module for short-range communications.

Here, the another mobile terminal 100 may be a wearable device, for example, a smart watch, smart glasses or a head mounted display (HMD), which is able to exchange data with the mobile terminal 100 (or to link data with the mobile terminal 100). The short-range communication module 114 may sense (recognize) a wearable device, which is able to communicate with the mobile terminal), near the mobile terminal 100. In addition, when the sensed wearable device is a device which is authenticated to communicate with the mobile terminal 100 according to the present disclosure, the controller 180 may transmit at least part of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a WiFi module, or both. For example, when the mobile terminal uses the GPS module, a position of the mobile terminal may be acquired using a signal sent from a GPS satellite. As another example, when the mobile terminal uses the Wi-Fi module, a position of the mobile terminal may be acquired based on information associated with a wireless access point (AP) which transmits or receives a wireless signal to or from the Wi-Fi module. According to the need, the location information module 115 may perform any function of the other modules of the wireless communication unit 110 to obtain data on the location of the mobile terminal. As a module used to acquire the location (or current location) of the mobile terminal, the location information module 115 may not be necessarily limited to a module for directly calculating or acquiring the location of the mobile terminal.

Then, the input unit 120 is configured to provide an video information (or signal), audio information (or signal), data or an input of information entered by a user, and the mobile terminal 100 may include one or a plurality of cameras 121 to enter video information. The camera 121 processes a image frame, such as still picture or video, acquired by an image sensor in a video phone call or image capturing mode. The processed image frames may be displayed on the display unit 151. On the other hand, the plurality of cameras 121 disposed in the mobile terminal 100 may be arranged in a matrix configuration. By use of the cameras 121 having the matrix configuration, a plurality of image information having various angles or focal points may be input into the mobile terminal 100. As another example, the cameras 121 may be located in a stereoscopic arrangement to acquire left and right images for implementing a stereoscopic image.

The microphone 122 may process an external audio signal into electric audio data. The processed audio data may be utilized in various manners according to a function being executed in the mobile terminal 100 (or an application program being executed). On the other hand, the microphone 122 may include assorted noise removing algorithms to remove noise generated in the course of receiving the external audio signal.

The user input unit 123 may receive information input by a user. When information is input through the user input unit 123, the controller 180 may control an operation of the mobile terminal 100 to correspond to the input information. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

On the other hand, the sensing unit 140 may sense at least one of internal information of the mobile terminal, surrounding environment information of the mobile terminal and user information, and generate a sensing signal corresponding to it. The controller 180 may control an operation of the mobile terminal 100 or execute data processing, a function or an operation associated with an application program installed in the mobile terminal based on the sensing signal. Hereinafter, description will be given in more detail of representative sensors of various sensors which may be included in the sensing unit 140.

First, a proximity sensor 141 refers to a sensor to sense presence or absence of an object approaching to a surface to be sensed, or an object disposed near a surface to be sensed, by using an electromagnetic field or infrared rays without a mechanical contact. The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 may sense proximity of a pointer to the touch screen by changes of an electromagnetic field, which is responsive to an approach of an object with conductivity. In this case, the touch screen (touch sensor) may also be categorized as a proximity sensor.

On the other hand, for the sake of brief explanation, a behavior in which the pointer is positioned to be proximate onto the touch screen without contact will be referred to as "proximity touch," whereas a behavior in which the pointer substantially comes into contact with the touch screen will be referred to as "contact touch." For the position corresponding to the proximity touch of the pointer on the touch screen, such position will correspond to a position where the pointer faces perpendicular to the touch screen upon the proximity touch of the pointer. The proximity sensor 141 may sense proximity touch, and proximity touch patterns (e.g., distance, direction, speed, time, position, moving status, etc.). On the other hand, the controller 180 may process data (or information) corresponding to the proximity touches and the proximity touch patterns sensed by the proximity sensor 141, and output visual information corresponding to the process data on the touch screen. In addition, the controller 180 may control the mobile terminal 100 to execute different operations or process different data (or information) according to whether a touch with respect to the same point on the touch screen is either a proximity touch or a contact touch.

A touch sensor may sense a touch (or touch input) applied onto the touch screen (or the display unit 151) using at least one of various types of touch methods, such as a resistive type, a capacitive type, an infrared type, a magnetic field type, and the like.

As one example, the touch sensor may be configured to convert changes of pressure applied to a specific part of the display unit 151 or a capacitance occurring from a specific part of the display unit 151, into electric input signals. Also, the touch sensor may be configured to sense not only a touched position and a touched area, but also touch pressure. Here, the touch object body may be a finger, a touch pen or stylus pen, a pointer, or the like as an object through which a touch is applied to the touch sensor.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180 or the controller 180 itself.

On the other hand, the controller 180 may execute a different control or the same control according to a type of an object which touches the touch screen (or a touch key provided in addition to the touch screen). Whether to execute the different control or the same control according to the object which gives a touch input may be decided based on a current operating state of the mobile terminal 100 or a currently executed application program.

Meanwhile, the touch sensor and the proximity sensor may be executed individually or in combination, to sense various types of touches, such as a short (or tap) touch, a long touch, a multi-touch, a drag touch, a flick touch, a pinch-in touch, a pinch-out touch, a swype touch, a hovering touch, and the like.

An ultrasonic sensor may be configured to recognize position information relating to a sensing object by using ultrasonic waves. On the other hands, the controller 180 may calculate a position of a wave generation source based on information sensed by an illumination sensor and a plurality of ultrasonic sensors. Since light is much faster than ultrasonic waves, a time for which the light reaches the optical sensor may be much shorter than a time for which the ultrasonic wave reaches the ultrasonic sensor. The position of the wave generation source may be calculated using the fact. In more detail, the position of the wave generation source may be calculated by using a time difference from the time that the ultrasonic wave reaches based on the light as a reference signal.

The camera 121 constructing the input unit 120 may be a type of camera sensor. The camera sensor may include at least one of a photo sensor (or image sensor) and a laser sensor.

Implementing the camera 121 with a laser sensor may allow detection of a touch of a physical object with respect to a 3D stereoscopic image. The photo sensor may be laminated on the display device. The photo sensor may be configured to scan a movement of the sensing object in proximity to the touch screen. In more detail, the photo sensor may include photo diodes and transistors at rows and columns to scan content placed on the photo sensor by using an electrical signal which changes according to the quantity of applied light. Namely, the photo sensor may calculate the coordinates of the sensing object according to variation of light to thus obtain position information of the sensing object.

The display unit 151 may display (output) information processed in the mobile terminal 100. For example, the display unit 151 may display execution screen information of an application program driven in the mobile terminal 100 or user interface (UI) and graphic user interface (GUI) information in response to the execution screen information.

Furthermore, the display unit 151 may also be implemented as a stereoscopic display unit for displaying stereoscopic images.

The stereoscopic display unit may employ a stereoscopic display scheme such as stereoscopic scheme (a glass scheme), an auto-stereoscopic scheme (glassless scheme), a projection scheme (holographic scheme), or the like.

In general, a 3-dimensional stereoscopic image may include a left image (image for the left eye) and a right image (image for the right eye). The method of implementing a 3-dimensional stereoscopic image can be divided into a top-down method in which a left image and a right image are disposed at the top and bottom within a frame, a left-to-right (L-to-R) or side by side method in which a left image and a right image are disposed at the left and right within a frame, a checker board method in which the pieces of a left image and a right image are disposed in a tile format, an interlaced method in which a left and a right image are alternately disposed for each column and row unit, and a time sequential or frame by frame method in which a left image and a right image are alternately displayed for each time frame, according to the method of combining a left image and a right image into a 3-dimensional stereoscopic image.

Also, as for a 3D thumbnail image, a left image thumbnail and a right image thumbnail may be generated from a left image and a right image of an original image frame, respectively, and then combined to generate a single 3D thumbnail image. In general, thumbnail refers to a reduced image or a reduced still image. The thusly generated left image thumbnail and the right image thumbnail may be displayed with a horizontal distance difference therebetween by a depth corresponding to the disparity between the left image and the right image on the screen, providing a stereoscopic space sense.

A left image and a right image required for implementing a 3D stereoscopic image may be displayed on the stereoscopic display unit by a stereoscopic processing unit. The stereoscopic processing unit can receive the 3D image and extract the left image and the right image, or can receive the 2D image and change it into a left image and a right image.

The audio output module 152 is generally configured to output audio data. Such audio data may be obtained from any of a number of different sources, such that the audio data may be received from the wireless communication unit 110 or may have been stored in the memory 170. Also, the audio output module 152 may also provide audible output signals associated with a particular function (e.g., a call signal reception sound, a message reception sound, etc.) carried out by the mobile terminal 100. The audio output module 152 may include a receiver, a speaker, a buzzer or the like.

A haptic module 153 may generate various tactile effects the that user may feel. A typical example of the tactile effect generated by the haptic module 153 may be vibration. Strength, pattern and the like of the vibration generated by the haptic module 153 may be controllable by a user selection or setting of the controller. For example, the haptic module 153 may output different vibrations in a combining manner or a sequential manner.

Besides vibration, the haptic module 153 may generate various other tactile effects, including an effect by stimulation such as a pin arrangement vertically moving with respect to a contact skin, a spray force or suction force of air through a jet orifice or a suction opening, a touch on the skin, a contact of an electrode, electrostatic force, etc., an effect by reproducing the sense of cold and warmth using an element that can absorb or generate heat, and the like.

The haptic module 153 may be configured to transmit tactile effects through a user's direct contact, or a user's muscular sense using a finger or a hand. Two or more haptic modules 153 may be provided according to the particular configuration of the mobile terminal 100.

An optical output module 154 may output a signal for indicating an event generation using the light of a light source of the mobile terminal 100. Examples of events generated in the mobile terminal 100 may include a message reception, a call signal reception, a missed call, an alarm, a schedule notice, an email reception, an information reception through an application, and the like.

A signal output by the optical output module 154 may be implemented in such a manner that the mobile terminal emits monochromatic light or light with a plurality of colors. The signal output may be ended as the mobile terminal senses a user's event checking.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identification device") may take the form of a smart card. Accordingly, the identifying device may be connected with the terminal 100 via the interface unit 160.

Furthermore, when the mobile terminal 100 is connected with an external cradle, the interface unit 160 may serve as a passage to allow power from the cradle to be supplied to the mobile terminal 100 therethrough or may serve as a passage to allow various command signals input by the user from the cradle to be transferred to the mobile terminal therethrough. Such various command signals or power inputted from the cradle may operate as signals for recognizing that the mobile terminal 100 has accurately been mounted to the cradle.

The memory 170 can store programs to support operations of the controller 180 and store input/output data (for example, phonebook, messages, still images, videos, etc.). The memory 170 may store data associated with various patterns of vibrations and audio which are output in response to touch inputs on the touch screen.

The memory 170 may include at least one type of storage medium including a Flash memory, a hard disk, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the mobile terminal 100 may be operated in relation to a web storage device that performs the storage function of the memory 170 over the Internet.

As aforementioned, the controller 180 may typically control the general operations of the mobile terminal 100. For example, the controller 180 may set or release a locked state for restricting a user from inputting a control command with respect to applications when a state of the mobile terminal meets a preset condition.

Furthermore, the controller 180 may also perform controlling and processing associated with voice calls, data communications, video calls, and the like, or perform pattern recognition processing to recognize a handwriting input or a picture drawing input performed on the touch screen as characters or images, respectively. In addition, the controller 180 may control one or combination of those components in order to implement various exemplary embodiment disclosed herein on the mobile terminal 100.

The power supply unit 190 may receive external power or internal power and supply appropriate power required for operating respective elements and components included in the electronic device 100 under the control of the controller 180. The power supply unit 190 may include a battery, which is typically rechargeable or be detachably coupled to the terminal body for charging.

Furthermore, the power supply unit 190 may include a connection port. The connection port may be configured as one example of the interface unit 160 to which an external (re)charger for supplying power to recharge the battery is electrically connected.

As another example, the power supply unit 190 may be configured to recharge the battery in a wireless manner without use of the connection port. Here, the power supply unit 190 may receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable or its similar medium using, for example, software, hardware, or any combination thereof.

Referring now to FIGS. 2 and 3, the mobile terminal 100 is described with reference to a bar-type terminal body. However, the present disclosure may not be necessarily limited to this, and may be also applicable to various structures such as a watch type, a clip type, a glasses type, a folder type in which two or more bodies are coupled to each other in a relatively movable manner, a slide type, a swing type, a swivel type, and the like. The description in association with a specific type of mobile terminal or on a specific type of mobile terminal will be also typically applied to another type of mobile terminal.

Here, the terminal body may be understood as a conception which indicates the mobile terminal 100 as at least one assembly.

The mobile terminal 100 may include a case (for example, a frame, a housing, a cover, etc.) constituting the appearance thereof. In this embodiment, the case may be divided into a front case 101 and a rear case 102. Various electronic components may be incorporated into a space formed between the front case 101 and the rear case 102. At least one middle case may be additionally disposed between the front case 101 and the rear case 102

A display unit 151 may be disposed on a front surface of the terminal body to output information. As illustrated, a window 151a of the display unit 151 may be mounted to the front case 101 so as to form the front surface of the terminal body together with the front case 101.

In some cases, electronic components may also be mounted to the rear case 102. Examples of those electronic components mounted to the rear case 102 may include a detachable battery, an identification module, a memory card and the like. Here, a back cover 103 for covering the electronic components mounted may be detachably coupled to the rear case 102. Therefore, when the back cover 103 is separated from the rear case 102, the electronic components mounted to the rear case 102 may be externally exposed.

As illustrated, when the back cover 103 is coupled to the rear case 102, a side surface of the rear case 102 may be partially exposed. In some cases, upon the coupling, the rear case 102 may also be completely shielded by the rear cover 103. On the other hand, the back cover 103 may include an opening portion for exposing the camera 121b or the audio output module 152b to the outside.

The cases 101, 102, 103 may be formed by injection-molding synthetic resin or may be formed of a metal, for example, stainless steel (STS), aluminum (Al), titanium (Ti), or the like.

Unlike the example which the plurality of cases form an inner space for accommodating such various components, the mobile terminal 100 may be configured such that one case forms the inner space. In this example, a mobile terminal 100 having a uni-body formed in such a manner that synthetic resin or metal extends from a side surface to a rear surface may also be implemented.

On the other hand, the mobile terminal 100 may include a waterproofing unit (not shown) for preventing an introduction of water into the terminal body. For example, the waterproof portion may include a waterproof member provided between the window 151a and the front case 101, between the front case 101 and the rear case 102, or between the rear case 102 and the back cover 103, to hermetically seal an inner space when those cases are coupled to each other.

The mobile terminal 100 may include a display unit 151, first and second audio output modules 152a and 152b, a proximity sensor 141, an illumination sensor 152, an optical output module 154, first and second cameras 121a and 121b, first and second manipulation units 123a and 123b, a microphone 122, an interface unit 160 and the like.

Hereinafter, description will be given of an exemplary mobile terminal 100 that the display unit 151, the first audio output module 152a, the proximity sensor 141, the illumination sensor 142, the optical output module 154, the first camera 121a and the first manipulation unit 123a are disposed on the front surface of the terminal body, the second manipulation unit 123b, the microphone 122 and the interface unit 160 are disposed on a side surface of the terminal body, and the second audio output module 152b and the second camera 121b are disposed on a rear surface of the terminal body, with reference to FIGS. 2 and 3.

However, the foregoing configuration may not be necessarily limited to the arrangement. The foregoing configuration may be excluded, substituted or disposed on another surface if necessary. For example, the first manipulation unit 123a may not be disposed on the front surface of the terminal body, and the second audio output module 152b may be disposed on the side surface other than the rear surface of the terminal body.

The display unit 151 may display (output) information processed in the mobile terminal 100. For example, the display unit 151 may display execution screen information of an application program driven in the mobile terminal 100 or user interface (UI) and graphic user interface (GUI) information in response to the execution screen information.

The display unit 151 may include at least one of a liquid crystal display (LCD), a thin film transistor-liquid crystal display (TFT-LCD), an organic light emitting diode (OLED), a flexible display, a 3-dimensional (3D) display, and an e-ink display.

The display unit 151 may be implemented in two or more in number according to a configured aspect of the mobile terminal 100. For instance, a plurality of the display units 151 may be arranged on one surface to be spaced apart from or integrated with each other, or may be arranged on different surfaces.

The display unit 151 may include a touch sensor which senses a touch onto the display unit so as to receive a control command in a touching manner. When a touch is input to the display unit 151, the touch sensor may be configured to sense this touch and the controller 180 may generate a control command corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

In this manner, the display unit 151 may form a flexible touch screen along with the touch sensor, and in this case, the touch screen may function as the user input unit 123 (refer to FIG. 1A). Therefore, the touch screen may replace at least some of the functions of the first manipulation unit 123a.

The first audio output module 152a may be implemented in the form of a receiver for transferring voice sounds to the user's ear or a loud speaker for outputting various alarm sounds or multimedia reproduction sounds.

The window 151a of the display unit 151 may include a sound hole for emitting sounds generated from the first audio output module 152a. Here, the present disclosure may not be limited to this. It may also be configured such that the sounds are released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 may output light for indicating an event generation. Examples of the event generated in the terminal 100 may include a message reception, a call signal reception, a missed call, an alarm, a schedule notice, an email reception, information reception through an application, and the like. When a user's event check is sensed, the controller 180 may control the optical output unit 154 to end the output of light.

The first camera 121a may process video frames such as still or moving images acquired by the image sensor in a video call mode or a capture mode. The processed video frames may be displayed on the display unit 151 or stored in the memory 170.

The first and second manipulation units 123a and 123b are examples of the user input unit 123, which may be manipulated by a user to input a command for controlling the operation of the mobile terminal 100. The first and second manipulation units 123a and 123b may employ any method if it is a tactile manner allowing the user to perform manipulation with a tactile feeling such as touch, push, scroll or the like. In addition, the first and second manipulation units 123a and 123b may also employ a method of allowing the user to perform manipulation without a tactile feeling through a proximity touch, a hovering touch, or the like.

The drawings are illustrated on the basis that the first manipulation unit 123a is a touch key, but the present disclosure may not be necessarily limited to this. For example, the first manipulation unit 123a may be configured with a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display unit 151, or the like.

On the other hand, as another example of the user input unit 123, a rear input unit (not shown) may be disposed on the rear surface of the terminal body. The rear input unit may be manipulated by a user to input a command for controlling an operation of the mobile terminal 100. The content input may be set in various ways. For example, the rear input unit may be used by the user to input a command, such as power on/off, start, end, scroll or the like, controlling a volume level being output from the first or second audio output module 152a or 152b, switching into a touch recognition mode of the display unit 151, or the like. The rear input unit may be implemented into a form allowing a touch input, a push input or a combination thereof.

The rear input unit may be disposed to overlap with the display unit 151 of the front surface in a thickness direction of the terminal body. As one example, the rear input unit may be disposed on an upper end portion of the rear surface of the terminal body such that a user can easily manipulate it using a forefinger when the user grabs the terminal body with one hand. However, the present disclosure may not be limited to this, and the position of the rear input unit may be changeable.

When the rear input unit is disposed on the rear surface of the terminal body, a new user interface may be implemented using the rear input unit. Also, the aforementioned touch screen or the rear input unit may substitute for at least part of functions of the first manipulation unit 123a located on the front surface of the terminal body. Accordingly, when the first manipulation unit 123a is not disposed on the front surface of the terminal body, the display unit 151 may be implemented to have a larger screen.

On the other hand, the mobile terminal 100 may include a fingerprint recognition sensor for recognizing a user's fingerprint, and the controller 180 may use fingerprint information sensed through the finger recognition sensor as an authentication means. The finger scan sensor may be installed in the display unit 151 or the user input unit 123.

The microphone 122 may be formed to receive the user's voice, other sounds, and the like. The microphone 122 may be provided at a plurality of places, and configured to receive stereo sounds.

The interface unit 160 may serve as a path allowing the mobile terminal 100 to exchange data with external devices. For example, the interface unit 160 may be at least one of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b may be further mounted to the rear surface of the terminal body. The second camera 121b may have an image capturing direction, which is substantially opposite to the direction of the first camera unit 121a.

The second camera 121b may include a plurality of lenses arranged along at least one line. The plurality of lenses may also be arranged in a matrix configuration. The cameras may be referred to as an "array camera." When the second camera 121b is implemented as the array camera, images may be captured in various manners using the plurality of lenses and images with better qualities may be obtained.

A flash 124 may be disposed adjacent to the second camera 121b. When an image of a subject is captured with the camera 121b, the flash 124 may illuminate the subject.

The second audio output module 152b may further be disposed on the terminal body. The second audio output module 152b may implement a stereo function in conjunction with the first audio output module 152a, and may be also used to implement a speakerphone mode during a call.

At least one antenna for wireless communication may be disposed on the terminal body. The antenna may be installed in the terminal body or formed on the case. For example, the antenna constituting the broadcast receiving module 111 (refer to FIG. 1) may be configured to be retractable from the body of the mobile terminal. Alternatively, an antenna may be formed in a form of film to be attached onto an inner surface of the rear cover 103 or a case including a conductive material may serve as an antenna.

A power supply unit 190 (refer to FIG. 1) for supplying power to the mobile terminal 100 may be disposed on the terminal body. The power supply unit 190 may include a batter 191 which is mounted in the terminal body or detachably coupled to an outside of the terminal body.

The battery 191 may receive power via a power source cable connected to the interface unit 160. Also, the battery 191 may be (re)chargeable in a wireless manner using a wireless charger. The wireless charging may be implemented by magnetic induction or electromagnetic resonance.

On the other hand, the drawing illustrates that the back cover 103 is coupled to the rear case 102 for shielding the battery 191, so as to prevent separation of the battery 191 and protect the battery 191 from an external impact or foreign materials. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may link with the display unit 151 to extend the function of the mobile terminal 100. Another example of the accessory may be a touch pen for assisting or extending a touch input onto a touch screen.

On the other hand, as described above, at least one antenna for wireless communication may be provided in the mobile terminal 100. For example, an antenna for implementing the 5th generation wireless communication may be provided in the mobile terminal 100.

In the case of the 4th generation wireless communication, a low-band frequency of 2 GHz or less is mainly used, whereas in the fifth generation wireless communication, a high-band frequency of about 28 GHz or 39 GHz is mainly used.

Communication using a low-band frequency has a wide coverage with a long wavelength, but the bandwidth is relatively narrow and the transmission speed is slow.

On the contrary, communication using a high-band frequency is relatively fast in transmission speed because of its relatively wide bandwidth, but its coverage is narrow with a short wavelength. Such a coverage constraint may be solved when using array elements having propagation characteristics with high linearity. Therefore, the fifth generation wireless communication may provide various communication services to a user with increased capacity.

Figure 4:
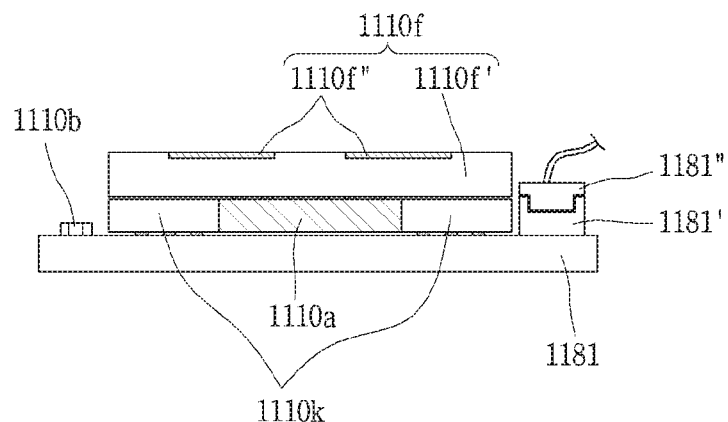
FIGS. 4 and 5 are conceptual views for explaining an AIP structure of a 5G antenna in the related art.
Figure 5:
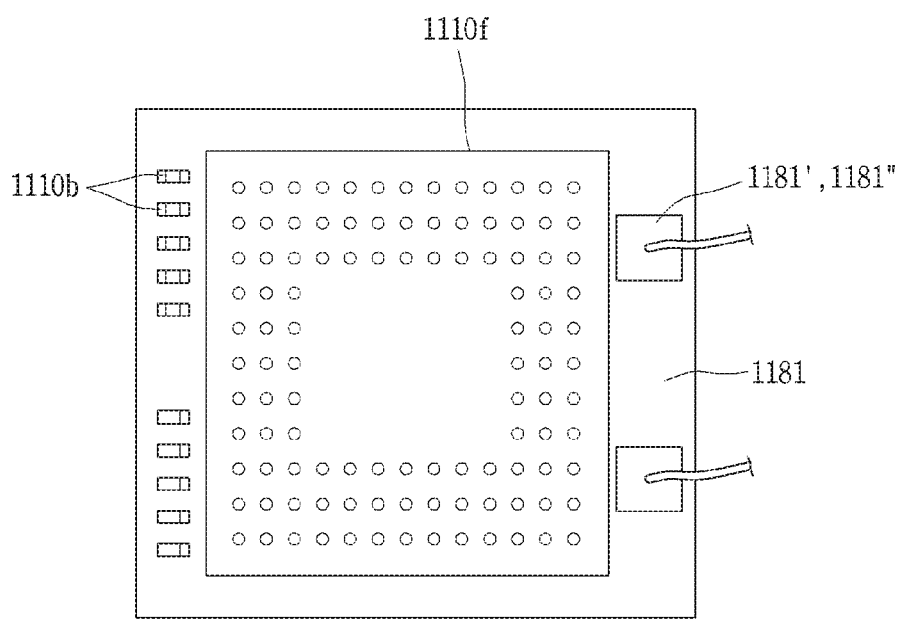

FIGS. 4 and 5 are conceptual views for explaining an AIP structure of a 5G antenna 1110*f* in the related art.

Referring to FIGS. 4 and 5, in order to reduce path loss, the antenna 1110*f* and the integrated circuit 1110*a* are generally modularized into a 1-package (AIP: Antenna in Package). The AIP has a structure in which the antenna 1110*f* is layered on the integrated circuit 1110*a*.

Specifically, the integrated circuit 1110*a* is mounted on the circuit board 1181. The antenna 1110*f* on which array elements 1110*f″* are arranged on an antenna substrate 1110*f′* is mounted on an upper surface of the integrated circuit 1110*a*. An interposer 1110*k* is disposed between the circuit board 1181 outside the integrated circuit 1110*a* and the antenna 1110*f*. The interposer 1110*k* supports the antenna 1110*f* and has a via for electrical connection to the antenna 1110*f*.

In accordance with the above structure, a size of the AIP is determined by a size of the antenna 1110*f*. However, since the antenna 1110*f* for 5G wireless communication is implemented as an array type arranged with elements, a size of the antenna 1110*f* increases as the array is formed, even though a size of each element is small. Therefore, an area occupied by the AIP on the circuit board 1181 is also increased by the size of the antenna 1110*f*.

For reference, the capacitor 1110*b* required for driving the integrated circuit 1110*a* may be disposed outside the interposer 1110*k*. The circuit board 1181 may be electrically connected to other electronic components (e.g., a battery), and connectors (e.g., coaxial connectors 1181', 1181") may be used for electrical connection.

This acts as a large design constraint in view of the fact that an area where electronic devices can be mounted on the circuit board of the mobile terminal gradually becomes insufficient. Accordingly, the present disclosure proposes a new antenna structure having the same functions as those of the AIP in the related art, capable of reducing the area occupied by the corresponding components on the circuit board.

Figure 6:
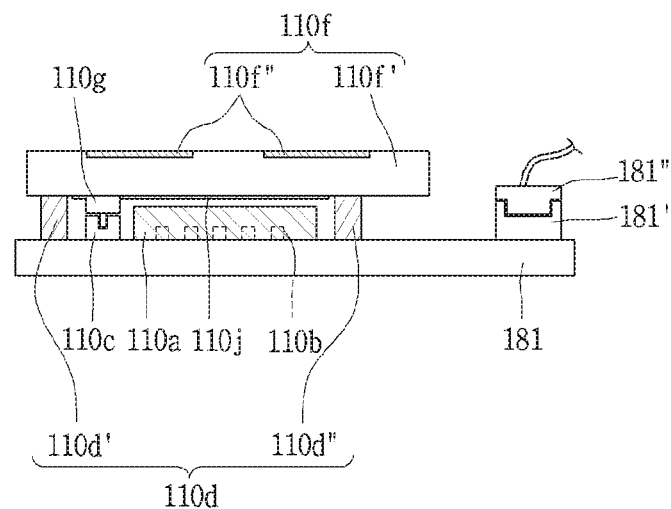
FIGS. 6 through 8 are conceptual views for explaining an example of a 5G antenna structure applied to a mobile terminal of the present disclosure.
Figure 7:
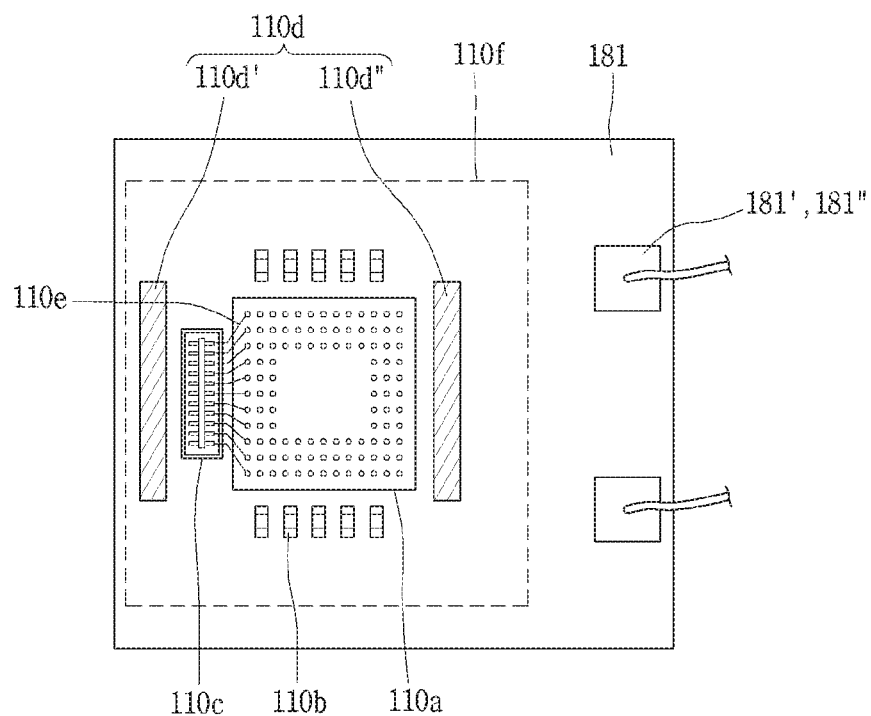
Figure 8:
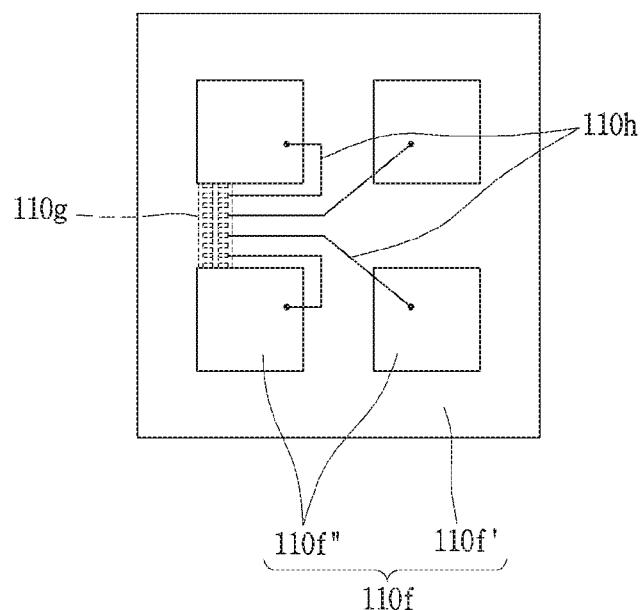

FIGS. 6 through 8 are conceptual views for explaining an example of the structure of the 5G antenna 110*f* applied to the mobile terminal 100 of the present disclosure. FIG. 6 is a side view of the structure of the 5G antenna 110*f*, FIG. 7 is a plan view showing components mounted on the circuit board 181 shown in FIG. 6, and FIG. 8 is a plan view showing components mounted on the flexible printed circuit board 182 illustrated in FIG. 6.

Referring to FIGS. 6 through 8, the present embodiment proposes a structure of separating the integrated circuit 110*a* and the antenna 110*f* using a board to board connector.

Specifically, the integrated circuit 110*a* and the first connector 110*c* are mounted on the rigid circuit board 181. The first connector 110*c* is disposed adjacent to one side of the integrated circuit 110*a*. The integrated circuit 110*a* and the first connector 110*c* are electrically connected through microstrip lines 110*e*.

The circuit board 181 may be electrically connected to other electronic components (e.g., a battery 191), and connectors (e.g., coaxial connectors 181', 181") may be used for electrical connection.

The antenna 110*f* is disposed to cover the integrated circuit 110*a* and the first connector 110*c*. The antenna 110*f* includes an antenna substrate 110*f′* and array elements 110*f″*. The array elements 110*f″* are mounted on an upper surface of the antenna substrate 110*f′*, and the second connector 110*g* is mounted on a lower surface of the antenna substrate 110*f′*. The array elements 110*f″* and the second connector 110*g* are electrically connected through microstrip lines 110*h*.

The second connector 110*g* is arranged to face the first connector 110*c*, and fastened to the first connector 110*c* when the antenna 110*f* is disposed to cover the integrated circuit 110*a* and the first connector 110*c*. The second connector 110*g* is fastened to the first connector 110*c*, and thus the integrated circuit 110*a* and the antenna 110*f* are electrically connected. Accordingly, power may be connected to the array elements 110*f″*, and the wireless transmission/reception of the array elements 110*f″* may be controlled by the integrated circuit 110*a*.

The first and second connectors 110*c*, 110*g* are board-to-board connectors, one of which is constituted by a receptacle connector and the other of which is constituted by a plug connector. The first and second connectors 110*c*, 110*g* are configured to transmit an IF (Intermediate Frequency) band signal, an LO (Local Oscillator) signal, a control signal, and power between the integrated circuit 110*a* and the antenna 110*f*.

The antenna 110*f* generates an RF (Radio Frequency) signal using an IF band signal and an LO signal to emit the RF signal.

The antenna 110*f* is supported by the first and second connectors 110*c*, 110*g*. However, the first and second connectors 110*c*, 110*g* are configured to support one area of the antenna 110*f*, and thus it is difficult to stably support the antenna 110*f* only by the first and second connectors 110*c*, 110*g*.

In order to stably support the antenna 110*f*, a support wall 110*d* may be formed on at least one side of the first and second connectors 110*c*, 110*g*.

For example, the support wall 110*d* may be formed on both sides of the circuit board 181 with the integrated circuit 110*a* and the first connector 110*c* interposed therebetween.

The support wall 110*d* may be disposed on both sides of the integrated circuit 110*a* and the first connector 110*c* or may be disposed to enclose the integrated circuit 110*a* and the first connector 110*c*. A capacitor 110*b* required for driving the integrated circuit 110*a* together with the integrated circuit 110*a* and the first connector 110*c* may be disposed between support walls 110*d*.

In this embodiment, it is illustrated that the support wall 110*d* includes a first wall 110*d'* disposed on one side of the integrated circuit 110*a* and a second wall 110*d"* disposed on one side of the first connector 110*c*. The first and second walls 110*d'*, 110*d"* are preferably formed at the same height as the combined first and second connectors 110*c*, 110*g*, and above the height of the integrated circuit 110*a* and the capacitor 110*b*.

During operation of the antenna 110*f*, a lot of heat is generated from the integrated circuit 110*a*. In particular, when the antenna 110*f* is supported by the support wall 110*d*, the integrated circuit 110*a* is laterally blocked by the support wall 110*d*, and outwardly blocked by the antenna 110*f*. Therefore, the heat dissipation structure of the integrated circuit 110*a* is a very important design element not only for the antenna 110*f* but also for the reliability of the mobile terminal 100.

In order to dissipate the heat of the integrated circuit 110*a*, the support wall 110*d* is formed of a heat dissipation material (for example, copper) to discharge heat generated from the integrated circuit 110*a* disposed inside the support wall 110. In addition, a heat radiation sheet 110*j* (for example, a graphite sheet) may be disposed between the integrated circuit 110*a* and the antenna substrate 110*f'*. The heat radiation sheet 110*j* may be disposed to cover a space inside the support wall 110*d* except for a portion where the first and second connectors 110*c*, 110*g* are disposed.

Due to the heat dissipation structure, heat generated from the integrated circuit 110*a* is discharged to an outside of the support wall 110*d* through the heat radiation sheet 110*j* and the support wall 110*d*. Therefore, the overheating of the integrated circuit 110*a* may be prevented, and the reliability of driving the antenna 110*f*, and the reliability of the mobile terminal 100 may be ensured.

As described above, the antenna 110*f* having the array elements 110*f"* may be disposed to cover the integrated circuit 110*a* and the first connector 110*c* mounted on the circuit board 181, and the second connector 110*g* may be mounted on a rear surface of the first connector 110*c* to be fastened to the first connector 110*c*, thereby increasing a marginal mounting space on the circuit board 181.

As a result, the increased marginal mounting space of the circuit board 181 may be as a space where other electronic devices can be mounted. Alternatively, a size of the circuit board 181 may be reduced as much as the marginal mounting space, and the reduced area may be used as an area of the battery 191.

Hereinafter, a structure in which the antennas 210*f*, 310*f* are mounted on the flexible printed circuit boards 282, 382 electrically connected to the circuit boards 281, 381 through board-to-board connectors 210*c*, 210*g*, 310*c*, 310*g* is proposed.

Specifically, the first connectors 210*c*, 310*c* are mounted on the rigid circuit boards 281, 381, and the second connectors 210*g*, 310*g* are mounted on the flexible printed circuit boards 282, 382. The second connectors 210*g*, 310*g* are fastened to the first connectors 210*c*, 310*c* to electrically connect the flexible printed circuit boards 282,282 to the circuit boards 281, 381.

The antennas 210*f*, 310*f* having array elements 210*f"*,310*f"'* are mounted on the flexible printed circuit boards 282, 382. Therefore, an area occupied by the antennas 210*f*, 310*f* on the circuit boards 281, 381 may be reduced to overcome a design constraint.

The integrated circuits 210*a*, 310*a* that control the transmission and reception of wireless signals of the antennas 210*f*, 310*f* may be mounted on the flexible printed circuit boards 282, 382 or may be mounted on the circuit boards 281, 381.

Hereinafter, a structure in which the integrated circuit 210*a* and the antenna 210*f* are modularized and mounted on the flexible printed circuit board 282 will be described with reference to FIGS. 9 and 10, and a structure in which the integrated circuit 310*a* and the antenna 310*f* are respectively mounted in a separate manner on the flexible printed circuit board 382. FIG.

Figure 9:
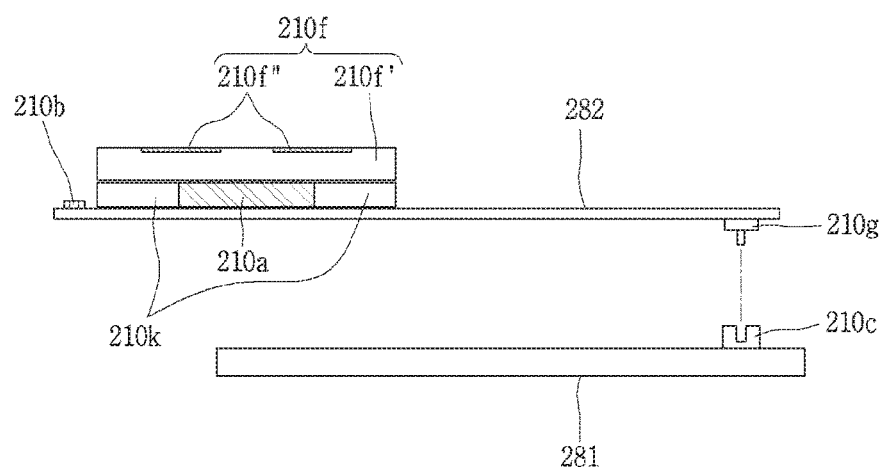
FIGS. 9 and 10 are conceptual views for explaining another example of a 5G antenna structure applied to a mobile terminal of the present disclosure.
Figure 10:
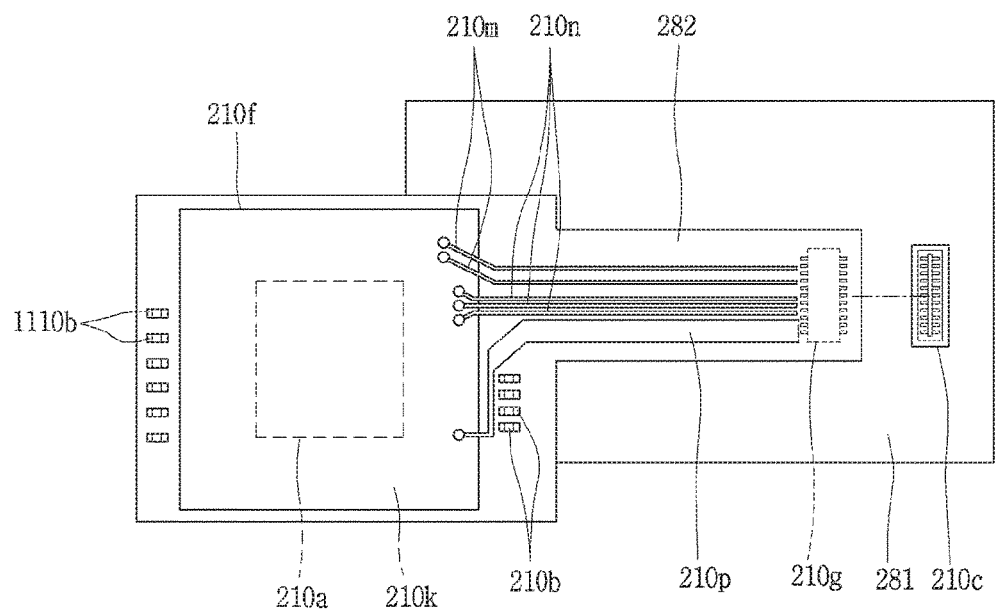

FIGS. 9 and 10 are conceptual views for explaining another example of the structure of the 5G antenna 210*f* applied to the mobile terminal 200 of the present disclosure. FIG. 9 is a conceptual view in which the structure of the 5G antenna 210*f* is seen in a lateral direction, and FIG. 10 is a conceptual view in which the structure of the 5G antenna 210*f* is seen from the top.

Referring to FIGS. 9 and 10, in this embodiment, it is shown that the integrated circuit 210*a* is mounted on the flexible printed circuit board 282, and modularized into 1-package (AIP: Antenna in Package) along with the antenna 210*f*. Accordingly, they may be referred to as an antenna module 210*f*.

Specifically, the integrated circuit 210*a* is mounted on the flexible printed circuit board 282. The antenna 210*f* on which array elements 210*f"'* are arranged on an antenna substrate 210*f'* is mounted on an upper surface of the integrated circuit 210*a*. An interposer 210*k* is disposed between the flexible printed circuit board 282 outside the integrated circuit 210*a* and the antenna 210*f*. The interposer 210*k* supports the antenna 210*f* and has a via for electrical connection to the antenna 210*f*.

On the other hand, the capacitor 210*b* required for driving the integrated circuit 210*a* is also mounted on the flexible printed circuit board 282. The capacitor 210*b* is disposed outside the interposer 210*k*.

The integrated circuit 210*a* and the second connector 210*g* may be mounted on different sides of the flexible printed circuit board 282.

The flexible printed circuit board 282 on which the antenna 210*f* module is mounted may be attached to a structure (e.g., a frame, a back cover, etc.) provided inside the mobile terminal 200 or attached to an upper surface of a shield can disposed to cover electronic devices.

The first and second connectors 210*c*, 110*g* are board-to-board connectors, one of which is constituted by a receptacle connector and the other of which is constituted by a plug connector. The second connector 210*g* and the antenna module 210*f* are electrically connected through microstrip lines 210*m*, 210*n*, 210*p*. The microstrip lines 210*m*, 210*n*, 210*p* include a line 210*m* for transmitting an IF (Intermediate Frequency) band signal and a LO (Local Oscillator) signal, a line 210*n* for transmitting a control signal, and a line 210*p* for transmitting power.

The antenna module 210*f* generates an RF (Radio Frequency) signal using an IF band signal and an LO signal to emit the RF signal.

The above structure has an advantage in that the antenna module 210*f* having a large size is separated from the circuit board 281 and mounted on the flexible printed circuit board 282 so that the area can be used as a mounting area of other components. In addition, the capacitor 210b required for driving the integrated circuit 210a is also mounted on the flexible printed circuit board 282, and thus an area occupied by the related components may also be used.

Figure 11:
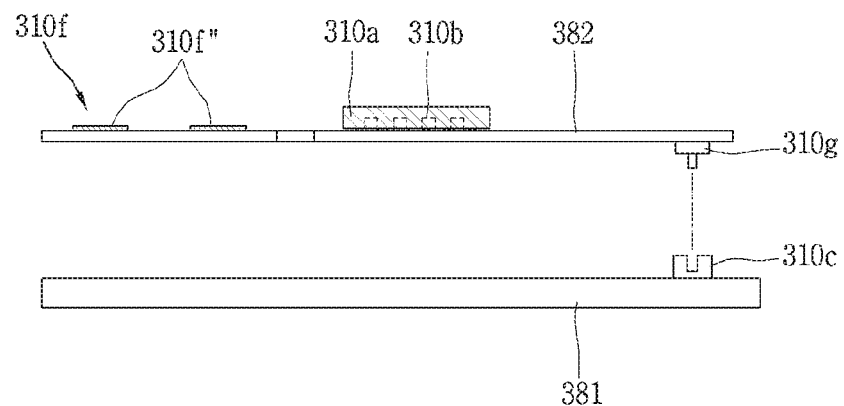
FIGS. 11 and 12 are conceptual views for explaining still another example of a 5G antenna structure applied to a mobile terminal of the present disclosure.
Figure 12:
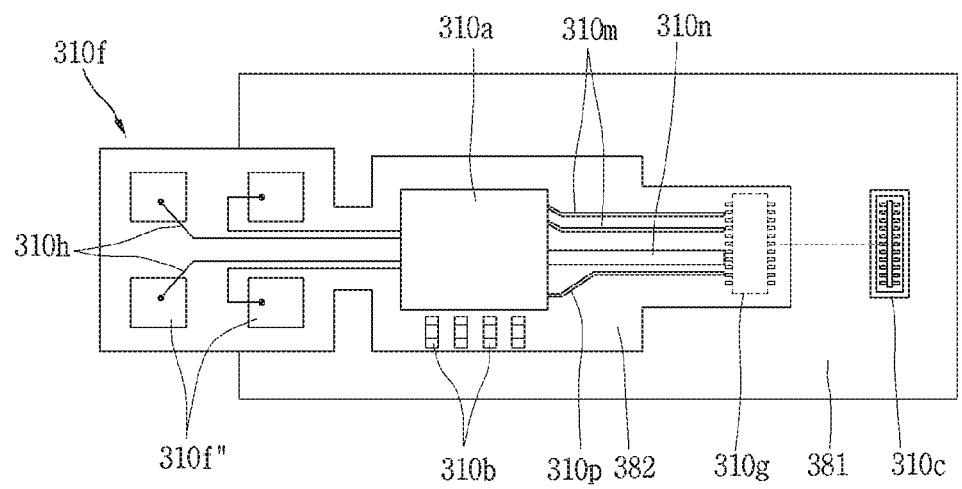

FIGS. 11 and 12 are conceptual views for explaining still another example of the structure of the 5G antenna 310f applied to the mobile terminal 300 of the present disclosure. FIG. 11 is a conceptual view in which the structure of the 5G antenna 310f is seen in a lateral direction, and FIG. 12 is a conceptual view in which the structure of the 5G antenna 210f is seen from the top.

Referring to FIGS. 11 and 12, the integrated circuit 310a and the antenna 310f are respectively mounted on the flexible printed circuit board 382. The antenna 310f may have a configuration in which the array elements 310f''' are arranged on the antenna substrate 310f', but as illustrated in the drawing, the array elements 310f''' may also be directly mounted on the flexible printed circuit board 382.

The integrated circuit 310a is disposed between the antenna 310f and the second connector 310g to control the transmission and reception of wireless signals of the antenna 310f.

The capacitor 310b required for driving the integrated circuit 310a is also mounted on the flexible printed circuit board 382. The capacitor 310b is disposed adjacent to the integrated circuit 310a.

Although it is illustrated that the integrated circuit 310a and the antenna 310f are mounted on the same side of the flexible printed circuit board 382 in the drawing, the present disclosure is not limited thereto. The integrated circuit 310a and the antenna 310f may be mounted on different surfaces of the flexible printed circuit board 382.

The first and second connectors 310c, 110g are board-to-board connectors, one of which is constituted by a receptacle connector and the other of which is constituted by a plug connector.

The second connector 310g and the integrated circuit 310a are electrically connected through microstrip lines 310m, 310n, 310p. The microstrip lines 310m, 310n, 310p include a line 310m for transmitting an IF (Intermediate Frequency) band signal and a LO (Local Oscillator) signal, a line 310n for transmitting a control signal, and a line 310p for transmitting power.

The integrated circuit 310a and the antenna 310f are electrically connected through microstrip lines 310h. The antenna 310f generates an RF (Radio Frequency) signal using an IF band signal and an LO signal to emit the RF signal.

The above structure has the following advantages in comparison with the structure illustrated in FIGS. 9 and 10 above.

First, the integrated circuit 310a and the antenna 310f''' are arranged in a layered form without being modularized, thereby decreasing the height of the structure. Therefore, it has a structure suitable for implementing the slim mobile terminal 300.

In addition, since the antenna 310f is configured with array elements 310f''' directly mounted on the flexible printed circuit board 382 without the antenna substrate 310f', the antenna 310f may be implemented in a thinner and more flexible manner. Therefore, a degree of freedom of installation of the antenna 310f may be further increased.

Moreover, the array elements 310f''' are mounted directly on the flexible printed circuit board 382, and thus the implementable types of antennas 310f may be increased. For example, the antenna 310f may be implemented in various forms such as a patch array antenna, a dipole array antenna, and the like.

Hereinafter, a structure in which the antenna 310f is configured with the array elements 310f''' mounted on the flexible printed circuit board 382 to have a further increased degree of freedom of installation of the antenna 310f will be described.

Figure 13:
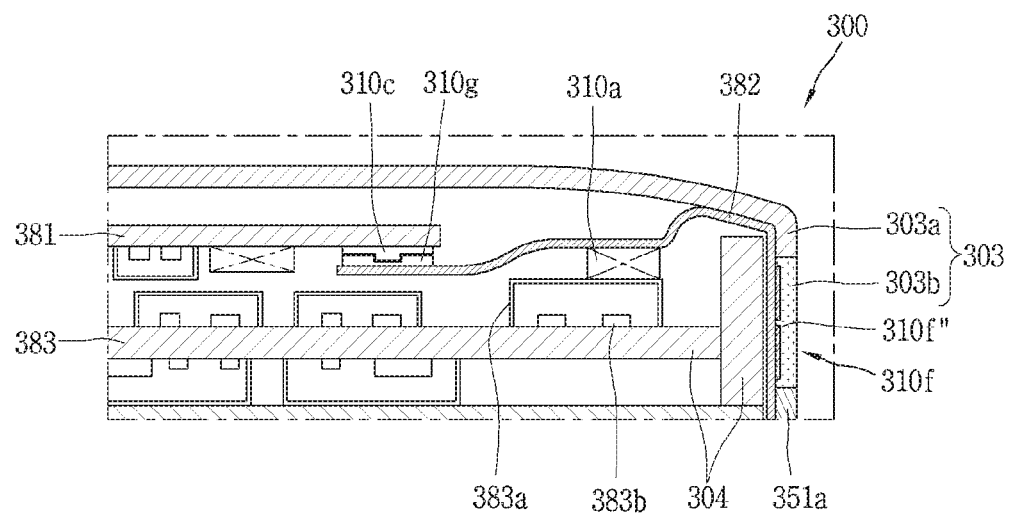
FIG. 13 is a conceptual view illustrating an example of a mobile terminal to which the 5G antenna structure illustrated in FIGS. 11 and 12 is applied.

FIG. 13 is a conceptual view illustrating an example of the mobile terminal 300 to which the 5G antenna structure 310f illustrated in FIGS. 11 and 12 is applied.

Referring to FIG. 13 along with FIGS. 11 and 12, the first connector 310c is mounted on a rigid circuit board 381 and the second connector 310g is mounted on a flexible printed circuit board 382. The second connector 310g is fastened to the first connector 310c to electrically connect the flexible printed circuit board 382 to the circuit board 381.

The circuit board 381 may be a main circuit board on which an AP (Application Processor) is mounted, or may be a sub circuit board 381 electrically connected to the main circuit board 383 as illustrated in the drawing.

The antenna 310f having array elements 310f''' is mounted on the flexible printed circuit board 382. The antenna 310f is disposed to face a side surface of the case (the back cover 303 in this drawing) adjacent to one side of the circuit board 381. The antenna 310f may be attached to the frame 304 facing the side surface of the case 303 or may be attached to an inner side of the case 303 as illustrated in the drawing.

It may be an unimplementable arrangement of the antenna 310f in the conventional structure, that is, in a structure in which the antenna 310f is modularized into the integrated circuit 310a as a 1-package on the circuit board 381. However, according to the present disclosure, there is no design limitation in the arrangement of the antenna 310f. According to the illustrated arrangement, beam-formed wireless signals may be radiated through a side surface of the case 303.

The side surface of the case 303 facing the antenna 310f may be preferably formed of a dielectric material to radiate beam-formed wireless signals through the side surface of the case 303. To this end, the case 303 may be formed entirely of a synthetic resin material, or may be a combination of a dielectric material and a metal material. The case 303 made of a combination of a dielectric material and a metal material will be described later in the description with reference to FIG. 14.

On the other hand, for the heat dissipation of the integrated circuit 310a, the integrated circuit 310a may be attached to a shield can 383a disposed to cover the electronic device 383b. Therefore, heat generated from the integrated circuit 310a may be dissipated through the shield can 383a.

Figure 14:
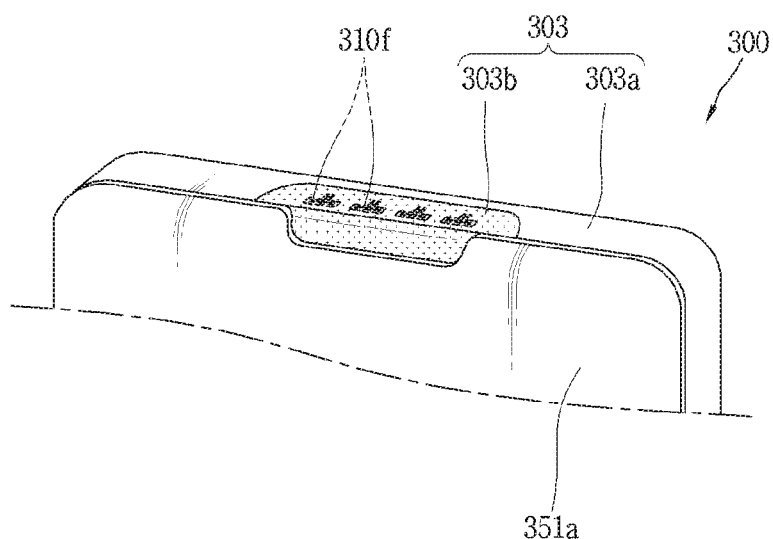
FIG. 14 is a conceptual view in which a side view of the mobile terminal illustrated in FIG. 13 is seen from the outside.

FIG. 14 is a conceptual view in which a side view of the mobile terminal 300 illustrated in FIG. 13 is seen from the outside.

Referring to FIG. 14, a metal material has a characteristic of blocking beam-formed radio signals radiated from the antenna 310f. Therefore, in order for beam-formed wireless signals radiated from the antenna 310f to pass through one area of the case 303, the one area is preferably formed of a dielectric material.

However, in recent years, in order to enhance an appearance of the mobile terminal, a case made of a metal material is mainly used, and a metal material of the case is used as a configuration of the antenna 310f.

It may be taken into consideration that the case 303 is configured with a combination of a metal portion 303a made of a metal material and a dielectric portion 303b made of a dielectric material.

The metal portion 303a has an opening at a side surface of the case 303 facing the antenna 310f, for example, in the case where an area through which wireless signals pass is disposed to face the side surface of the case 303. The metal portion 303a may form the remaining side surface of the case 303 except the opening. The dielectric portion 303b is disposed to cover the opening. The antenna 310f may be attached to the dielectric portion 303b or attached to the frame 304 facing the dielectric portion 303b.

Figure 15:
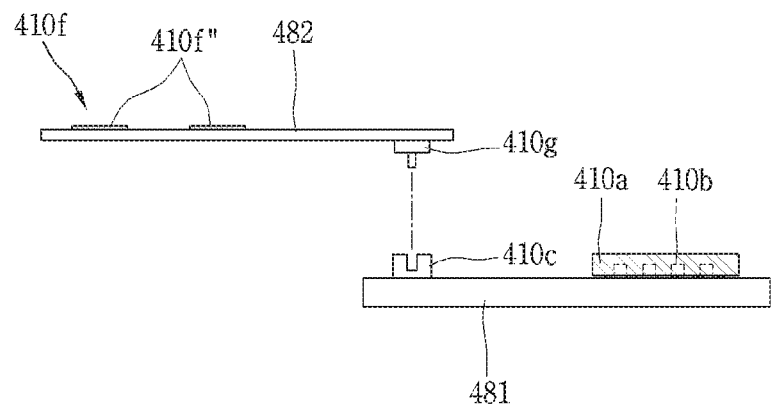
FIGS. 15 and 16 are conceptual views showing a modified example of the 5G antenna structure illustrated in FIGS. 11 and 12.
Figure 16:
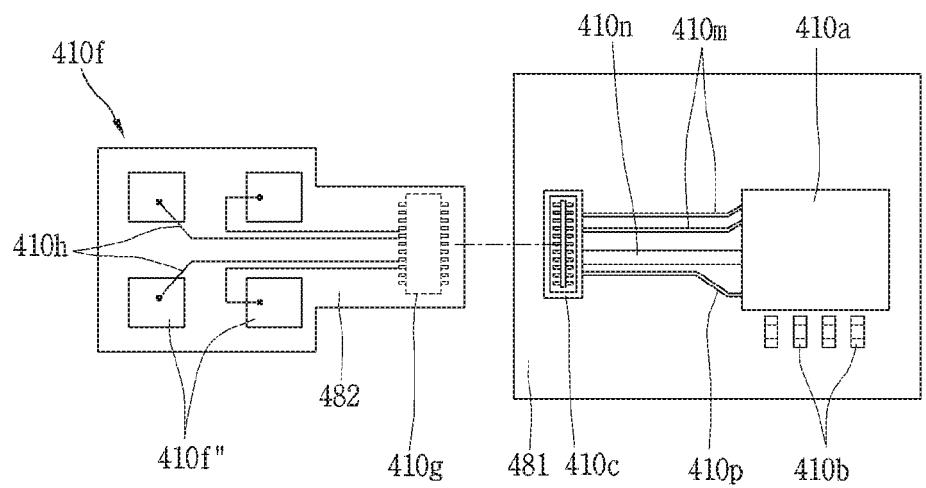

FIGS. 15 and 16 are conceptual views showing a modified example of the 5G antenna structure illustrated in FIGS. 11 and 12. FIG. 15 is a conceptual view in which the structure of the 5G antenna 410f is seen in a lateral direction, and FIG. 16 is a conceptual view in which the structure of the 5G antenna 410f is seen from the top.

In FIGS. 11 and 12, it has been described that the integrated circuit 310a is mounted on the flexible printed circuit board 382, but the present disclosure is not limited thereto. The array elements 410f" constituting the antenna 410f may be mounted on the flexible printed circuit board 482 and the integrated circuit 410a may also be mounted on the circuit board 481.

In order to reduce signal loss between the antenna 410f and the integrated circuit 410a when the integrated circuit 410a is mounted on the circuit board 481, the integrated circuit 410a is preferably disposed adjacent to the first connector 410c. The integrated circuit 410a and the first connector 410c are electrically connected through microstrip lines 410m, 410n, 410p. Furthermore, the capacitor 410b required for driving the integrated circuit 410a is also mounted at a position adjacent to the integrated circuit 410a of the circuit board 481.

Moreover, the array elements 410f" and the second connector 410g are electrically connected through microstrip lines 410h.

When the second connector 410g is fastened to the first connector 410c, the integrated circuit 410a and the antenna 410f are electrically connected. Accordingly, power may be connected to the array elements 410f", and the wireless transmission/reception of the array elements 410f" may be controlled by the integrated circuit 410a.

As described above, the integrated circuit 410a may be mounted on the rigid circuit board 481 rather than the flexible printed circuit board 482, thereby improving mass productivity due to the above structure. In addition, even when a failure occurs in the antenna 410f, since only the flexible printed circuit board 482 on which the antenna 410f is mounted can be replaced, repairing cost may be reduced according to the above structure.

Hereinafter, a structure in which the integrated circuits 510a, 610a are mounted on the flexible printed circuit boards 582, 682 will be described as an example, but the present disclosure is not limited thereto. The integrated circuits 510a, 610a may be mounted on the circuit boards 581 and 681, respectively.

Figure 17:
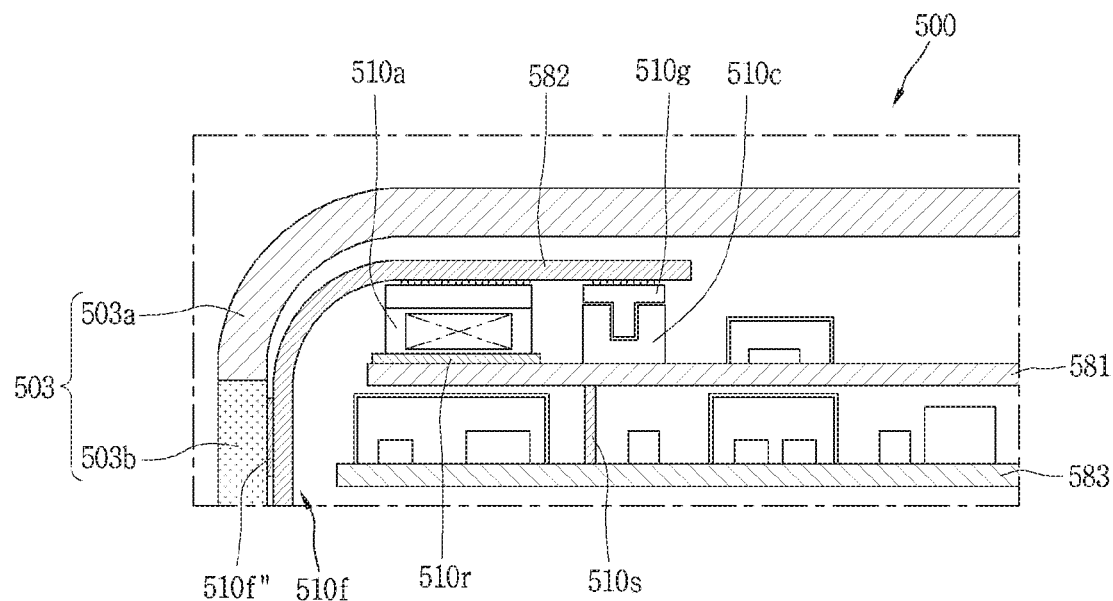
FIG. 17 is a conceptual view illustrating another example of a mobile terminal to which the 5G antenna structure illustrated in FIGS. 11 and 12 is applied.

FIG. 17 is a conceptual view illustrating another example of the mobile terminal 500 to which the 5G antenna structure 310f illustrated in FIGS. 11 and 12 is applied.

The structure illustrated in FIG. 17 is not much different from the structure illustrated in FIG. 13, except that the integrated circuit 510a is attached to the circuit board 581 rather than the shield can 383a.

As illustrated in the drawing, the integrated circuit 510a may be attached to the circuit board 581, and a heat dissipation plate 510r may be disposed between the integrated circuit 510a and the circuit board 581 for heat dissipation. The heat dissipation plate 510r may be formed of a copper material.

The circuit board 581 and another circuit board 583 may be connected by a heat transfer wall 510s to transfer heat when the another circuit board 583 disposed in a layered form on the circuit board 581 is provided. The heat transfer wall 510s may be formed of a copper material. According to the above structure, heat generated from the integrated circuit 510a spreads widely to prevent the integrated circuit 510a from being overheated.

Figure 18:
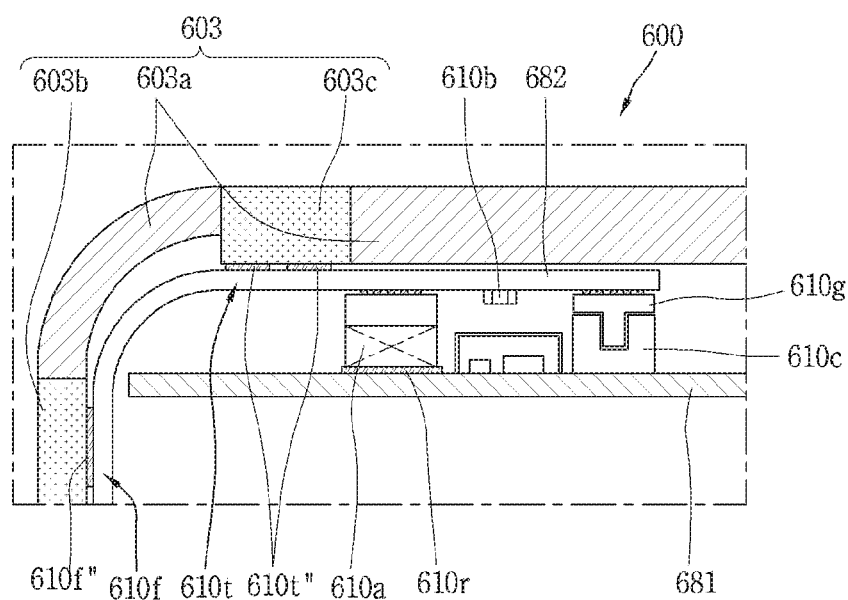
FIG. 18 is a conceptual view illustrating still another example of a mobile terminal to which the 5G antenna structure illustrated in FIGS. 11 and 12 is applied.

FIG. 18 is a conceptual view illustrating still another example of the mobile terminal 600 to which the 5G antenna structure 310f illustrated in FIGS. 11 and 12 is applied.

The flexible printed circuit board 682 may be provided with a plurality of antennas 610f, 610t for 5G wireless communication. Referring to FIG. 18, the first antenna 610f and the second antenna 610t are mounted on the flexible printed circuit board 682 at positions spaced apart from each other.

The second antenna 610t is disposed between the first antenna 610f and the second connector 610g. In other words, the second antenna 610t is disposed adjacent to the second connector 610g than the first antenna 610f.

Although the first and second antennas 610f, 610t have a configuration in which the array elements 610f", 610t" are arranged on the antenna substrate, the array elements 610f", 610t" may be mounted directly on the flexible printed circuit board 682. In other words, the array elements 610f" of the first antenna 610f may be mounted at a portion extended from a portion where the array elements 610t" of the second antenna 610t are mounted.

The first antenna 610f is disposed to face a side surface of the case (the back cover 603 in this drawing) adjacent to one side of the circuit board 681. The antenna 610f may be attached to the frame facing the side surface of the case 603 or may be attached to an inner side of the case 603 as illustrated in the drawing. According to the illustrated arrangement, beam-formed wireless signals may be radiated through a side surface of the case 603.

The second antenna 610t is disposed to face a rear surface of the case 603 facing the circuit board 681. The antenna 610f may be attached to a rear inner inside of the case 603. According to the illustrated arrangement, beam-formed wireless signals may be radiated through a rear surface of the case 603.

The case 603 is configured with a combination of a metal portion 603a made of a metal and a first dielectric portion 603b and a second dielectric portion 603b made of a dielectric material.

The metal portion 603a has a first opening on a side surface of the case 603 facing the first antenna 610f The metal portion 603a may form the remaining side surface of the case 603 except the first opening. The first dielectric portion 603b is disposed to cover the first opening. The first antenna 610f may be attached to the first dielectric portion 603b or attached to a frame facing the first dielectric portion 603b.

Moreover, the metal portion 603a has a second opening on a rear surface of the case 603 facing the second antenna 610t. The metal portion 603a may form the remaining rear surface of the case 603 except the second opening. The second dielectric portion 603b is disposed to cover the second opening. The second antenna 610*t* may be attached to the second dielectric portion 603*b*.

The second dielectric portion 603*b* may be formed of a specific pattern such as a manufacturer's logo of the mobile terminal 600, a telecommunication company logo, and the like.

The first and second antennas 610*f*, 610*t* may be implemented with different array antennas. For example, either one of the first and second antennas 610*f*, 610*t* may be configured with a patch array antenna, and the other one may be configured with a dipole array antenna.

The integrated circuit 610*a* is mounted between the second antenna 610*t* and the second connector 610*g* of the flexible printed circuit board 682 to control the transmission and reception of wireless signals of the first and second antennas 610*f*, 610*t*.

The capacitor 610*b* required for driving the integrated circuit 610*a* is also mounted on the flexible printed circuit board 682. Capacitor 610*b* is disposed adjacent to the integrated circuit 610*a*.

In the above, it has been described that the integrated circuit 610*a* is mounted on the flexible printed circuit board 682, but the present disclosure is not limited thereto. The array elements 610*f''*, 610*t''* constituting the first and second antennas 610*f*, 610*t* may be mounted on the flexible printed circuit board 682, and the integrated circuit 610*a* may also be mounted on the circuit board 681. In order to reduce signal loss between the antenna 610*f* and the integrated circuit 610*a* when the integrated circuit 610*a* is mounted on the circuit board 681, the integrated circuit 610*a* is preferably disposed adjacent to the first connector 610*c*.

The foregoing detailed description should not be construed as restrictive but considered as illustrative in all aspects. The scope of the invention should be determined by reasonable interpretation of the appended claims and all changes that come within the equivalent scope of the invention are included in the scope of the invention.

What is claimed is:

1. A mobile terminal, comprising:
   a case forming a portion of an appearance of the mobile terminal;
   a rigid circuit board disposed inside the case;
   a flexible printed circuit board electrically connected to the rigid circuit board;
   a first connector mounted on the circuit board;
   a second connector mounted on the flexible printed circuit board and configured to engage with the first connector;
   a first antenna comprising array elements mounted on the flexible printed circuit board,
   wherein the first antenna is disposed internal to a first surface of the case and facing outwardly toward the first surface of the case and configured to radiate beam-formed wireless signals outwardly through the first surface which is adjacent to one side of the circuit board, and
   wherein the first surface of the case corresponds to a lateral side edge of the mobile terminal, and
   an integrated circuit attached to the rigid circuit board and configured to control transmission and reception of the beam-formed wireless signals from the array elements of the first antenna mounted on the flexible printed circuit board,
   wherein the case comprises:
   a metal portion formed of a metal material for blocking the beam-formed wireless signals and formed with an opening at the first surface; and
   a dielectric portion formed of a dielectric material in order for the beam-formed wireless signals radiated from the array elements of the first antenna to pass therethrough and disposed to cover the opening such that the first antenna radiates the beam-formed wireless signals outwardly through the opening and the dielectric portion.

2. The mobile terminal of claim 1, wherein the first antenna is coupled to the dielectric portion or coupled to a frame facing the dielectric portion.

3. The mobile terminal of claim 1, further comprising a heat dissipation plate disposed between the integrated circuit and the circuit board for heat dissipation,
   wherein the integrated circuit is also mounted on the flexible printed circuit board.

4. The mobile terminal of claim 3, wherein the integrated circuit is mounted on the flexible printed circuit board between the first antenna and the second connector.

5. The mobile terminal of claim 3, further comprising another circuit board connected by the heat transfer wall to transfer heat, wherein the another circuit board is disposed in a layered form on the circuit board,
   wherein the heat generated from the integrated circuit is dispersed to prevent the integrated circuit from being overheated.

6. The mobile terminal of claim 3, wherein the first antenna further comprises an antenna substrate mounted on the integrated circuit, and wherein the array elements are mounted on the antenna substrate.

7. The mobile terminal of claim 1, further comprising an interposer configured to support the first antenna and comprising a via for electrical connection with the first antenna, wherein the interposer is disposed to surround the integrated circuit and is between the flexible printed circuit board and the first antenna.

8. The mobile terminal of claim 1, further comprising:
   a second antenna comprising array elements mounted on the flexible printed circuit board,
   wherein the second antenna is disposed to face a second surface of the case and configured to radiate beam-formed wireless signals through the second surface of the case which faces the circuit board, and
   wherein the second surface of the case corresponds to a rear side of the mobile terminal.

9. The mobile terminal of claim 8, wherein the case comprises:
   a metal portion formed of a metal material, wherein the metal portion is formed with a first opening at the first surface facing the first antenna and a second opening at the second surface facing the second antenna;
   a first dielectric portion formed of a dielectric material and disposed to cover the first opening; and
   a second dielectric portion formed of a dielectric material and disposed to cover the second opening.

10. The mobile terminal of claim 8, wherein the first surface of the case corresponds to a lateral side edge of the mobile terminal and the second surface of the case corresponds to a rear side of the mobile terminal.

11. The mobile terminal of claim 8, wherein one of the first and second antennas is configured as a patch array antenna and the other of the first and second antennas is configured as a dipole array antenna.

12. The mobile terminal of claim 8, wherein the first antenna is mounted on the flexible printed circuit board at a first portion extending from a second portion on which the second antenna is mounted.

13. The mobile terminal of claim 12, further comprising:
an integrated circuit mounted on the flexible printed circuit board and configured to control transmission and reception of wireless signals of the first and second antennas,
wherein the integrated circuit is mounted on the flexible printed circuit board between the first antenna and the second connector.

14. The mobile terminal of claim 8, further comprising:
an integrated circuit mounted on the circuit board adjacent to the first connector and configured to control transmission and reception of wireless signals of the first and second antennas.

15. A mobile terminal, comprising:
a case forming a portion of an appearance of the mobile terminal;
a rigid circuit board;
an integrated circuit mounted on the rigid circuit board;
a first connector mounted on the circuit board and disposed at one side of the integrated circuit;
an antenna comprising an antenna substrate and array elements mounted on the antenna substrate, wherein the antenna is configured to control transmission and reception of beam-formed wireless signals by the integrated circuit and is disposed to cover the integrated circuit and the first connector; and
a second connector mounted on a rear surface of the antenna substrate and electrically connected to the array elements, wherein the second connector is configured to engage with the first connector,
wherein the second connector engages with the first connector when the antenna is disposed to cover the integrated circuit and the first connector with respect to the thickness direction, and
wherein the integrated circuit is attached to the rigid circuit board and configured to control transmission and reception of the beam-formed wireless signals from the array elements of the first antenna mounted on the flexible printed circuit board, and
wherein the case comprises:
a metal portion formed of a metal material for blocking the beam-formed wireless signals and formed with an opening at the first surface; and
a dielectric portion disposed to cover the opening and formed of a dielectric material in order for the beam-formed wireless signals radiated from the array elements of the first antenna to pass through the opening and the dielectric portion.

16. The mobile terminal of claim 15, wherein one of the first and second connectors is a board-to-board receptacle connector, and the other of the first and second connectors is a board-to-board plug connector.

17. The mobile terminal of claim 15, further comprising:
a plurality of support walls formed on the circuit board, wherein the integrated circuit and the first connector are disposed between the plurality of support walls,
wherein the antenna is supported by the plurality of support walls and disposed to cover the integrated circuit and the first connector.

18. The mobile terminal of claim 17, wherein the plurality of support walls are formed of a copper material and comprise a first wall disposed on one side of the integrated circuit and a second wall disposed on one side of the first connector.

19. The mobile terminal of claim 18, wherein a graphite sheet is disposed between the integrated circuit and the antenna substrate.

* * * * *